(12) United States Patent
Iwata et al.

(10) Patent No.: US 6,876,055 B2
(45) Date of Patent: Apr. 5, 2005

(54) SEMICONDUCTOR DEVICE AND ITS PRODUCTION METHOD

(75) Inventors: Hiroshi Iwata, Ikoma-gun (JP); Akihide Shibata, Nara (JP); Seizo Kakimoto, Shiki-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 37 days.

(21) Appl. No.: 10/399,902

(22) PCT Filed: Oct. 19, 2001

(86) PCT No.: PCT/JP01/09179

§ 371 (c)(1),
(2), (4) Date: Apr. 23, 2003

(87) PCT Pub. No.: WO02/35606

PCT Pub. Date: May 2, 2002

(65) Prior Publication Data

US 2004/0012068 A1 Jan. 22, 2004

(30) Foreign Application Priority Data

Oct. 23, 2000 (JP) .................................... 2000-322713

(51) Int. Cl.⁷ .............................................. H01L 29/72
(52) U.S. Cl. ...................... 257/510; 257/511; 257/513; 257/514
(58) Field of Search ................................ 257/510, 511, 257/513, 514

(56) References Cited

U.S. PATENT DOCUMENTS 6,040,610 A 3/2000 Noguchi et al.
6,255,704 B1 7/2001 Iwata et al.

FOREIGN PATENT DOCUMENTS

| JP | 59-84572 A | 5/1984 |
|---|---|---|
| JP | 2-89358 A | 3/1990 |
| JP | 5-251647 A | 9/1993 |
| JP | 6-216346 A | 8/1994 |
| JP | 7-273184 A | 10/1995 |
| JP | 7-273184 | * 10/1995 |
| JP | 10-22462 A | 1/1998 |
| JP | 10-135453 A | 5/1998 |
| JP | 10-340998 A | 12/1998 |
| JP | 11-330223 A | 11/1999 |

OTHER PUBLICATIONS

Kotaki et al Electron Devices Meeting, 1998. IEDM '98 Technical Digest, International, IEEE, pp. 415–418.*

* cited by examiner

Primary Examiner—Edward Wojciechowicz
(74) Attorney, Agent, or Firm—Birch, Stewart, Kolasch & Birch, LLP

(57) ABSTRACT

A semiconductor device having a two-layer well structure and a small margin required at the boundary of a well region and comprising a substrate-bias variable transistor and a DTMOS. Field effect transistors (223) are formed on a P-type shallow well region (212). The depth of a shallow device isolation region (214) on the P-type shallow well region (212) is less than the depth of the junction between an N-type deep well region (227) and the P-type shallow well region (212). Therefore the field effect transistors (223) share the P-type shallow well region (212). The P-type shallow well regions (212) independently of each other are easily formed since they are isolated from each other by a deep device isolation region (226) and the N-type deep well region (227).

17 Claims, 17 Drawing Sheets

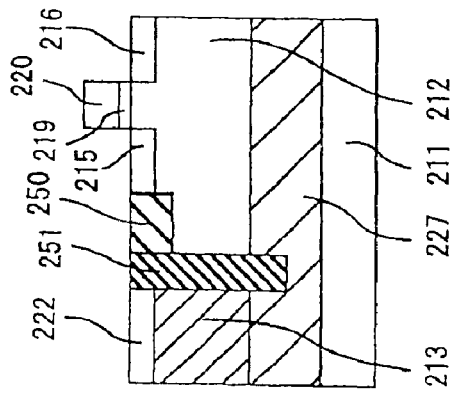
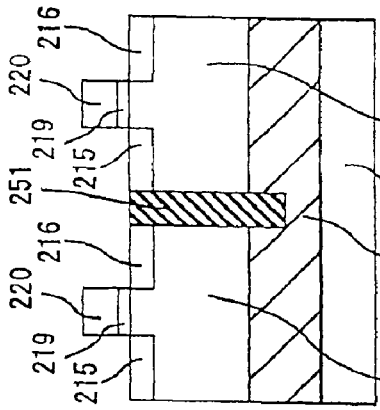
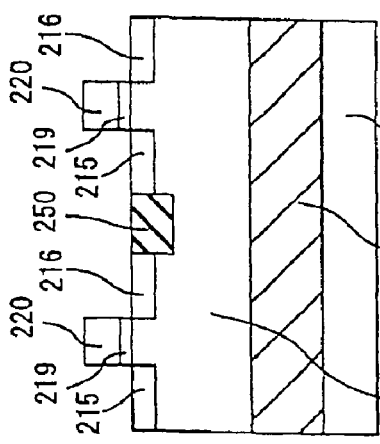
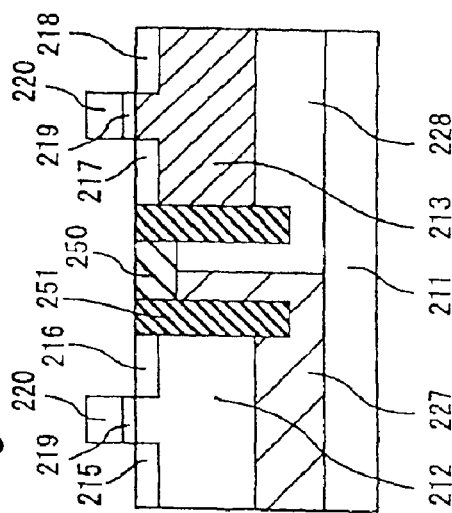
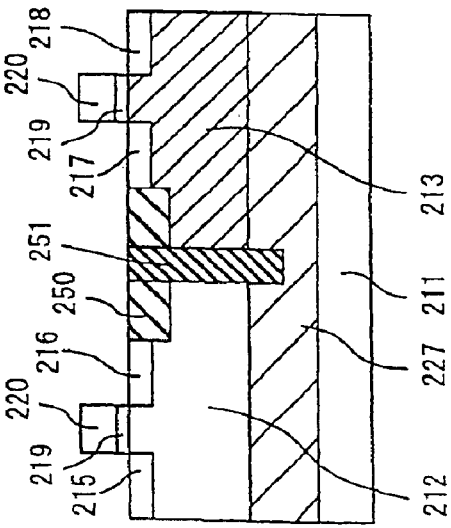

SEMICONDUCTOR DEVICE AND ITS PRODUCTION METHOD

This application is the national phase under 35 U.S.C. §371 of PCT International Application No. PCT/JP01/09179 which has an International filing date of Oct. 19, 2001, which designated the United States of America.

TECHNICAL FIELD

The present invention relates to a semiconductor device including field effect transistors, such as MOSFETs (Metal Oxide Semiconductor Field Effect Transistors), and device isolation regions. More particularly, the invention relates to a semiconductor device in which voltage of well regions of the field effect transistors changes.

BACKGROUND ART

As a conventional method which is low in drive voltage to suppress off-leaks and still aimed at obtaining high drive current in CMOS (Complementary Metal Oxide Semiconductor) circuits using MOSFETs, there has been a method in which the well bias voltage is changed between standby and active states (see Japanese Patent Laid-Open Publications HEI 6-216346 and 10-340998).

FIG. 16 shows a schematic cross-sectional view of a MOSFET in which the well bias is changed (hereinafter, the transistor will be referred to as substrate-bias variable transistor). Referring to FIG. 16, there are shown, with reference numerals having the following denotations, a substrate 211, a P-type well region 212, an N-type well region 213, a device isolation region 214, an N-type source region 215, an N-type drain region 216, a P-type source region 217, a P-type drain region 218, a gate insulator 219, a gate electrode 220, a P$^+$ diffusion layer 221 for providing contact with a P-type shallow well region, an N$^+$ diffusion layer 222 for providing contact with an N-type shallow well region, an N-type substrate-bias variable transistor 223, a P-type substrate-bias variable transistor 224, and further numeral 230 denotes a bias generation circuit A and numeral 231 denotes a bias generation circuit B.

The principle of operation of the N-type substrate-bias variable transistor 223 is explained below. It is noted that the P-type substrate-bias variable transistor 224, when reversed in polarity, operates in a similar manner. Referring to the N-type substrate-bias variable transistor 223, when the circuit is in an active state, the a 0 V or positive voltage (with a source voltage referenced) is applied from the bias generation circuit A to the P-type well region. With a positive voltage applied to the P-type well region, the effective threshold lowers due to a substrate-bias effect, and the drive current increases as compared with the case of normal MOSFETs. When the circuit is in a standby state, on the other hand, a negative voltage is applied from the bias generation circuit A to the P-type well region. As a result of this, the effective threshold increases due to the substrate-bias effect, and the off-leak decreases as compared with normal MOSFETs.

As a conventional method which is low in drive voltage and still aimed at obtaining high drive current in CMOS circuits using MOSFETs, there have been dynamic threshold transistors (hereinafter, referred to as DTMOS'). In a DTMOS, the gate electrode and the well region are short-circuited, and the effective threshold lowers only while the device is in the ON state. This makes it possible to increase the drive current alone while the off-leak is maintained as it is. There is disclosed a technique that the above-mentioned substrate-bias variable transistor and the DTMOS are combined together to exploit their respective advantages (Japanese Patent Laid-Open Publication HEI 10-340998).

FIG. 17 shows a cross-sectional view of a device fabricated by this technique. Referring to FIG. 17, there are shown, with reference numerals having the following denotations, a P-type semiconductor substrate 311, an N-type deep well region 312, a P-type deep well region 313, an N-type shallow well region 314, a P-type shallow well region 315, a device isolation region 316, an N-type MOSFET source region 317, an N-type MOSFET drain region 318, a P-type MOSFET source region 319, a P-type MOSFET drain region 320, an N$^+$ diffusion layer 321 for providing contact with an N-type shallow well region, a P+diffusion layer 322 for providing contact with a P-type shallow well region, a gate insulator 323, a gate electrode 324, a P-type substrate-bias variable transistor 325, an N-type substrate-bias variable transistor 326, an N-type DTMOS 327, a P-type DTMOS 328, a well bias input 329 for the P-type substrate-bias variable transistor 325, a well bias input 330 for the N-type substrate-bias variable transistor 326, and a fixed bias input 331 for the P-type deep well. In addition, although not shown, the gate electrode 324 and the P-type shallow well region 315 are electrically short-circuited in the DTMOS 327, and the gate electrode 324 and the N-type shallow well region 314 are electrically short-circuited in the DTMOS 328.

In the DTMOS' 327 and 328, the voltages of the shallow well regions 315 and 314 change in response to the voltage of the gate electrode 324. Therefore, under each shallow well region is formed a deep well region of opposite polarity, and the recess-type isolation region 316 is formed at enough depth to electrically isolate shallow well regions of its mutually neighboring devices, thereby being electrically isolated from the shallow wells of the neighboring devices. Meanwhile, shallow well regions of substrate-bias variable transistors present in one circuit block have to be provided in common. Therefore, under the P-type shallow well region 315 of the N-type substrate-bias variable transistor 326 in FIG. 17, is formed the P-type deep well region 313, which is integrated with a P-type shallow well region to form a common well region. To this P-type common well region, a voltage that differs between active and standby states is given via the well bias input 330 for the N-type substrate-bias variable transistor 326. In order to prevent any effects on devices of other circuit blocks or the DTMOS portion, the N-type deep well region 312 is formed further deeper in the substrate, by which the P-type deep well region 313 is electrically isolated. Under the shallow well region 314 of the P-type substrate-bias variable transistor 325 in FIG. 17, is formed the N-type deep well region 312, which is integrated with the N-type shallow well region to form a common well region. To this N-type common well region, a voltage that differs between active and standby states is given via the well bias input 329 for the P-type substrate-bias variable transistor. Thus, a circuit in which a substrate-bias variable transistor and a DTMOS are formed on one substrate to exploit their respective advantages can be implemented.

In the circuit using the substrate-bias variable transistors 223 and 224, biases of the well regions 212 and 213 are changed against a plurality of MOSFETs 223 and 224. Accordingly, the MOSFETs 223 or 224 have to share a well region. For this purpose, the depth of the bottom face of the device isolation region 214 in FIG. 16 is set deeper than the depth of the junction between the source regions and drain regions of the MOSFETs 223, 224 and their well region and, at the same time, shallower than the depth of the lower end of the well region.

However, for example, if the conductive type of the semiconductor substrate 211 in FIG. 16 is P type, the P-type well region would be all in common. That is, N-type transistors on the same substrate would be put all into the active state or all into the standby state, as an issue.

In the prior art technique in which the DTMOS and the substrate-bias variable transistor are combined together (Japanese Patent Laid-Open Publication HEI 10-340998), a three-layer well structure (N-type shallow well region 314/ P-type deep well region 313/N-type deep well region 312) is formed at the portion of the P-type DTMOS 328 in order to make up the complementary type structure. As a result, the well region would extend to a very large depth. Forming a well having such a very large depth would indispensably involve injection of very high energy, leading to an increase in crystal defect as a result. This in turn would incur an increase in leak current due to the crystal defects. Further, high-temperature annealing for recovering from the crystal defects would be involved, which would cause the diffusion distance of dopants to elongate noticeably. As a result, margin for the boundary of the well regions would increase, which would obstruct the implementation of higher integration.

DISCLOSURE OF THE INVENTION

It is therefore an object of the present invention to provide a semiconductor device using a substrate-bias variable transistor, as well as a manufacturing method therefor, in which a plurality of circuit blocks are formed on one substrate and which allows those circuit blocks to be appropriately apportioned into active state and standby state and which is small in margin required for the boundary of the well regions.

Another object of the present invention is to provide a semiconductor device using a substrate-bias variable transistor and a DTMOS, as well as a manufacturing method therefor, which is small in leak current due to crystal defects and small in margin required for the boundary of the well regions.

In order to achieve the above objects, according to a first aspect of the present invention, there is provided a semiconductor device comprising:

a semiconductor substrate;

a first-conductive-type deep well region formed in the semiconductor substrate;

a second-conductive-type shallow well region formed in the first-conductive-type deep well region;

a plurality of field effect transistors formed on the second-conductive-type shallow well region;

a shallow device isolation region which is formed on the second-conductive-type shallow well region and which has a depth less than a depth of a junction between the first-conductive-type deep well region and the second-conductive-type shallow well region;

a deep device isolation region which is formed on the first-conductive-type deep well region through the second-conductive-type shallow well region and which has a depth more than the depth of the junction between the first-conductive-type deep well region and the second-conductive-type shallow well region; and a terminal which is formed on the second-conductive-type shallow well region and which serves for changing a voltage of the second-conductive-type shallow well region.

In this constitution, a plurality of field effect transistors are formed on the second-conductive-type shallow well region, and the shallow device isolation region on the second-conductive-type shallow well region has a depth less than the depth of the junction between the first-conductive-type deep well region and the second-conductive-type shallow well region. Therefore, the plurality of field effect transistors can share the second-conductive-type shallow well region within a circuit block. The second-conductive-type shallow well region, on the other hand, is isolated by the deep device isolation region and the first-conductive-type deep well region, thus making it implementable to easily form a plurality of second-conductive-type shallow well regions independent from one another. Therefore, it becomes possible to apply different well biases to the plurality of second-conductive-type shallow well regions, respectively, via the terminal, so that the field effect transistors can be made to serve as substrate-bias variable transistors. As a result of this, it becomes implementable to provide a plurality of circuit blocks each composed of a plurality of substrate-bias variable transistors on one substrate. Consequently, it becomes implementable to properly divide the circuit blocks into active-state circuit blocks and standby-state circuit blocks, thus making it possible to suppress useless power consumption to a minimum while maintaining the high-speed operation of field effect transistors.

Moreover, by the combinational use of the shallow device isolation region and the deep device isolation region, a two-layer well structure can be implemented, allowing the isolation of the well region to be achieved with smaller margin than in the prior-art device isolation process. For example, two basic circuit blocks can easily be isolated from each other by one deep device isolation region. Thus, a semiconductor device of higher integration can be realized.

Consequently, according to the semiconductor device in the first aspect of the invention, an integrated circuit including substrate-bias variable transistors capable of high-speed operation, low-power-consumption operation and high integration is provided.

In a second aspect of the present invention, there is provided a semiconductor device comprising:

a semiconductor substrate;

first-conductive-type and second-conductive-type deep well regions formed in the semiconductor substrate;

a second-conductive-type shallow well region formed in the first-conductive-type deep well region;

a first-conductive-type shallow well region formed in the second-conductive-type deep well region;

a plurality of field effect transistors formed on the first-conductive-type and second-conductive-type shallow well regions;

a shallow device isolation region which is formed on the second-conductive-type shallow well region and which has a depth less than a depth of a junction between the first-conductive-type deep well region and the second-conductive-type shallow well region;

a shallow device isolation region which is formed on the first-conductive-type shallow well region and which has a depth less than a depth of a junction between the second-conductive-type deep well region and the first-conductive-type shallow well region;

a deep device isolation region which is formed on the first-conductive-type deep well region through the second-conductive-type shallow well region and which has a depth more than the depth of the junction between the first-conductive-type deep well region and the second-conductive-type shallow well region;

a deep device isolation region which is formed on the second-conductive-type deep well region through the first-conductive-type shallow well region and which has a depth more than the depth of the junction between the second-conductive-type deep well region and the first-conductive-type shallow well region;

a boundary-portion device isolation region provided at a boundary portion between the first-conductive-type and the second-conductive-type deep well regions and at a boundary portion between the first-conductive-type and the second-conductive-type shallow well regions; and a terminal which is formed on the first-conductive-type and the second-conductive-type shallow well regions and which serves for changing voltages of the first-conductive-type and the second-conductive-type shallow well regions.

The semiconductor device of the second aspect of the invention is fulfilled by making up the semiconductor device of the first aspect into a complementary-type structure. Therefore, the same working effects as those of the semiconductor device of the first aspect can be produced, and moreover the field effect transistors can be given symmetric output characteristics, allowing the power consumption to be further lowered.

In a third aspect of the present invention, there is provided a semiconductor device comprising:

a semiconductor substrate;

a first-conductive-type deep well region formed in the semiconductor substrate;

first-conductive-type and second-conductive-type shallow well regions formed in the first-conductive-type deep well region;

a plurality of field effect transistors formed on the first-conductive-type and second-conductive-type shallow well regions;

a shallow device isolation region which is formed on the first-conductive-type and second-conductive-type shallow well regions and which has a depth less than a depth of a junction between the first-conductive-type deep well region and the second-conductive-type shallow well region;

a deep device isolation region which is formed on the first-conductive-type deep well region through the second-conductive-type shallow well region and which has a depth more than a depth of a junction between the first-conductive-type deep well region and the second-conductive-type shallow well region;

a boundary-portion device isolation region provided at a boundary portion between the first-conductive-type and the second-conductive-type shallow well regions; and a terminal which is formed on the second-conductive-type shallow well region and which serves for changing a voltage of the second-conductive-type shallow well region.

In the semiconductor device of the third aspect of the invention, its structure at the second-conductive-type shallow well region and the first-conductive-type deep well region is identical to that of the semiconductor device of the first aspect of the invention, thus producing the same working effects as those of the semiconductor device of the first aspect.

Meanwhile, the first-conductive-type shallow well region may be commonized with first-conductive-type shallow well regions present at other places through the first-conductive-type deep well region. In this case, a plurality of field effect transistors present on the commonized first-conductive-type shallow well region may be formed as normal field effect transistors, or as one circuit block composed of substrate-bias variable transistors.

In one embodiment, the field effect transistors have a stacking-type structure in which source region and drain region of each field effect transistor are partly positioned upper than a plane formed by gate oxide of the field effect transistor.

According to this embodiment, by virtue of the source regions and the drain regions being given in the stacked type, even if the contact has overflowed into the device isolation region, making the device isolation region dug, the junction between the source regions/the drain regions and the well regions is not exposed, so that leak current does not matter.

Furthermore, by being given in the stacked type as described above, the source regions and the drain regions increase in surface area, which allows larger contact areas between the surfaces of the source regions and drain regions and the contact to be more easily taken during the contact formation.

Still further, in an integrated circuit composed of substrate-bias variable transistors, the device area can effectively be reduced by virtue of the use of two types of device isolation regions different in depth from each other and the use of field effect transistors having stacked-type source regions and drain regions. In particular, in the case where the shallow device isolation region is formed of STI, there occur almost no bird's beaks, thus making it possible to exploit the full characteristic that the stacked-type source regions and drain regions are small in width.

Consequently, according to this embodiment, an integrated circuit including substrate-bias variable transistors capable of further reduction in device area and high integration is provided.

In a fourth aspect of the present invention, there is provided a semiconductor device comprising:

a semiconductor substrate;

a first-conductive-type deep well region formed in the semiconductor substrate;

a second-conductive-type shallow well region formed in the first-conductive-type deep well region;

a plurality of field effect transistors formed on the second-conductive-type shallow well region;

a dynamic threshold transistor which is formed on the second-conductive-type shallow well region and in which a gate electrode and the second-conductive-type shallow well region are short-circuited;

a shallow device isolation region which is formed on the second-conductive-type shallow well region and which has a depth less than a depth of a junction between the first-conductive-type deep well region and the second-conductive-type shallow well region;

a deep device isolation region which is formed on the first-conductive-type deep well region through the second-conductive-type shallow well region and which has a depth more than the depth of the junction between the first-conductive-type deep well region and the second-conductive-type shallow well region; and a terminal which is formed on the second-conductive-type shallow well region and which serves for changing a voltage of the second-conductive-type shallow well region shared by the plurality of field effect transistors, wherein the dynamic threshold transistor is isolated from other devices by the deep device isolation region.

In the semiconductor device of the fourth aspect of the invention, since the second-conductive-type shallow well region is not isolated in the shallow device isolation region, the second-conductive-type shallow well region becomes common within one circuit block. Meanwhile, since the second-conductive-type shallow well regions are isolated by the deep device isolation region and the first-conductive-type deep well region, a plurality of independent shallow well regions can easily be formed. Accordingly, different well biases can be applied to the plurality of second-conductive-type shallow well regions, respectively, via the terminal. This makes it possible to provide a plurality of circuit blocks on one substrate. Consequently, it becomes implementable to properly divide the circuit blocks into active-state circuit blocks and standby-state circuit blocks, thus making it possible to suppress useless power consumption to a minimum while maintaining the high-speed operation of field effect transistors.

Further, according to this semiconductor device, the device isolation of the dynamic threshold transistors is facilitated by the deep device isolation region. Accordingly, there is no need for using the three-layer well structure for mixing the substrate-bias variable transistors and the dynamic threshold transistors, as would be involved in the prior art. Thus, the energy for dopant ion injection during the formation of the deep well regions can be lowered, so that crystal defects can be reduced. As a result of this, the annealing temperature for recovery of crystal defects can be lowered, so that the diffusion of dopant ions can be suppressed. Consequently, a device smaller in leak current due to crystal defects can be obtained, and moreover the margin required for boundaries of well regions can be reduced.

Thus, an integrated circuit including substrate-bias variable transistors and dynamic threshold transistors capable of high-speed operation, low-power-consumption operation and high integration is provided.

In a fifth aspect of the present invention, there is provided a semiconductor device comprising:

a semiconductor substrate;

first-conductive-type and second-conductive-type deep well regions formed in the semiconductor substrate;

a second-conductive-type shallow well region formed in the first-conductive-type deep well region;

a first-conductive-type shallow well region formed in the second-conductive-type deep well region;

a plurality of field effect transistors formed on the first-conductive-type and second-conductive-type shallow well regions;

dynamic threshold transistors which are formed on the first-conductive-type and second-conductive-type shallow well regions, respectively, and in each of which a gate electrode and the first-conductive-type and second-conductive-type shallow well regions are short-circuited;

a shallow device isolation region which is formed on the second-conductive-type shallow well region and which has a depth less than a depth of a junction between the first-conductive-type deep well region and the second-conductive-type shallow well region;

a shallow device isolation region which is formed on the first-conductive-type shallow well region and which has a depth less than a depth of a junction between the second-conductive-type deep well region and the first-conductive-type shallow well region;

a deep device isolation region which is formed on the first-conductive-type deep well region through the second-conductive-type shallow well region and which has a depth more than the depth of the junction between the first-conductive-type deep well region and the second-conductive-type shallow well region;

a deep device isolation region which is formed on the second-conductive-type deep well region through the first-conductive-type shallow well region and which has a depth more than the depth of the junction between the second-conductive-type deep well region and the first-conductive-type shallow well region;

a boundary-portion device isolation region provided at a boundary portion between the first-conductive-type and the second-conductive-type deep well regions and at a boundary portion between the first-conductive-type and the second-conductive-type shallow well regions; and a terminal which is formed on the first-conductive-type and the second-conductive-type shallow well regions and which serves for changing voltages of the first-conductive-type and the second-conductive-type shallow well regions, wherein each of the dynamic threshold transistors is isolated from other devices by the deep device isolation region.

The semiconductor device of the fifth aspect of the invention is fulfilled by making up the semiconductor device of the fourth aspect into a complementary-type structure. Therefore, the same working effects as those of the semiconductor device of the fourth aspect of the invention can be produced, and moreover the field effect transistors can be given symmetric output characteristics, allowing the power consumption to be further lowered.

In a sixth aspect of the present invention, there is provided a semiconductor device comprising:

a semiconductor substrate;

a first-conductive-type deep well regions formed in the semiconductor substrate;

first-conductive-type and second-conductive-type shallow well regions formed in the first-conductive-type deep well region;

a plurality of field effect transistors formed on the first-conductive-type and second-conductive-type shallow well regions;

a dynamic threshold transistor which is formed on the second-conductive-type shallow well region and in which a gate electrode and the second-conductive-type shallow well region are short-circuited;

a shallow device isolation region which is formed on the first-conductive-type and second-conductive-type shallow well regions and which has a depth less than a depth of a junction between the first-conductive-type deep well region and the second-conductive-type shallow well region;

a deep device isolation region which is formed on the first-conductive-type deep well region through the second-conductive-type shallow well region and which has a depth more than the depth of the junction between the first-conductive-type deep well region and the second-conductive-type shallow well region;

a boundary-portion device isolation region provided at a boundary portion between the first-conductive-type and the second-conductive-type shallow well regions; and a terminal which is formed on the second-conductive-type shallow well region and which serves for changing a voltage of the second-conductive-type shallow well region, wherein the dynamic threshold transistor is isolated from other devices by the deep device isolation region.

In the semiconductor device of the sixth aspect of the invention, its structure at the second-conductive-type shallow well region and the first-conductive-type deep well region is identical to that of the semiconductor device of the first aspect of the invention, thus producing the same working effects as those of the semiconductor device of the fourth aspect.

Meanwhile, the first-conductive-type shallow well region may be commonized with first-conductive-type shallow well regions present at other places through the first-conductive-type deep well region. In this case, a plurality of field effect transistors present on the commonized first-conductive-type shallow well region may be formed as normal field effect transistors, or as one circuit block composed of substrate-bias variable transistors.

In one embodiment, the field effect transistors and the dynamic threshold transistors have a stacking-type structure in which source region and drain region of each field effect transistor and each dynamic threshold transistor are partly positioned upper than a plane formed by gate oxide of the field effect transistor and the dynamic threshold transistor.

According to this embodiment, by virtue of the source regions and the drain regions being given in the stacked type, even if the contact has overflowed into the device isolation region, making the device isolation region dug, the junction between the source regions/the drain regions and the well regions is not exposed, so that leak current does not matter.

Furthermore, by being given in the stacked type as described above, the source regions and the drain regions increase in surface area, which allows larger contact areas between the surfaces of the source regions and drain regions and the contact to be more easily taken during the contact formation.

Still further, in an integrated circuit composed of substrate-bias variable transistors and dynamic threshold transistors, the device area can effectively be reduced by virtue of the use of two types of device isolation regions different in depth from each other and the use of field effect transistors having stacked-type source regions and drain regions. In particular, in the case where the shallow device isolation region is formed of STI, there occur almost no bird's beaks, thus making it possible to exploit the full characteristic that the stacked-type source regions and drain regions are small in width.

Consequently, according to this embodiment, an integrated circuit including substrate-bias variable transistors and dynamic threshold transistors capable of further reduction in device area and high integration is provided.

In one embodiment of the semiconductor device according to the second or sixth aspect of the invention, the boundary-portion device isolation region is a composite device isolation region which is provided at a boundary portion between the first-conductive-type and the second-conductive-type deep well regions and at a boundary portion between the first-conductive-type and the second-conductive-type shallow well regions, and which is composed of a shallow device isolation region having a depth less than a depth of a junction between the shallow well regions and the deep well regions, and deep device isolation regions positioned on both sides of the shallow device isolation region and having a depth more than the depth of the junction.

According to this embodiment, the same working effects as those of the semiconductor device of the second aspect of the invention or the same working effects as those of the semiconductor device of the fifth aspect of the invention are produced.

Still also, the composite device isolation region has deep device isolation regions formed on both sides of the shallow device isolation region. For this composite device isolation region, it is easier to fulfill the filling of oxide, as compared with the case where merely a large-width deep device isolation region is provided. This makes it relatively easier to form the large-width composite device isolation region. Further, with this composite device isolation region, by virtue of the presence of the deep device isolation regions on both sides of the shallow device isolation region, it becomes implementable to effectively prevent punch-throughs between the first-conductive-type deep well region and the first-conductive-type shallow well region, or between the second-conductive-type deep well region and the second-conductive-type shallow well region. Therefore, the basic circuit block composed of the first-conductive-type substrate-bias variable transistors and the basic circuit block composed of the second-conductive-type substrate-bias variable transistors can effectively be isolated from each other with less device isolation margin.

In one embodiment of the semiconductor device according to the third or sixth aspect of the invention, the boundary-portion device isolation region is a composite device isolation region which is provided at a boundary portion between the first-conductive-type and the second-conductive-type shallow well regions, and which is composed of a deep device isolation region having a depth more than a depth of a junction between the first-conductive-type deep well region and the second-conductive-type shallow well region, and shallow device isolation regions positioned on both sides of the deep device isolation region and having a depth less than the depth of the junction.

According to this embodiment, the same working effects as those of the semiconductor device of the third aspect of the invention or the same working effects as those of the semiconductor device of the sixth aspect are produced.

Furthermore, the composite device isolation region comprises a deep device isolation region and shallow device isolation regions positioned on both sides of the shallow device isolation region. Therefore, it is easier to fulfill the filling of oxide into the composite device isolation region, as compared with the case where merely a large-width deep device isolation region is provided. This makes it relatively easier to form the large-width composite device isolation region. Further, with this composite device isolation region, it becomes implementable to effectively isolate the first-conductive-type and the second-conductive-type shallow well regions with less device isolation margin, and therefore to suppress changes in threshold value of field effect transistors.

In one embodiment, the shallow device isolation region is formed of LOCOS oxide.

According to this embodiment, two types of device isolation regions of different depths can be formed with relatively simple process.

In one embodiment, the shallow device isolation region is formed of STI.

According to this embodiment, since the shallow device isolation region is formed of STI, there are no noticeable bird's beaks as would be involved in the case where LOCOS oxide is used. Accordingly, the margin required for device isolation can be further reduced.

In a seventh aspect of the present invention, the method for manufacturing the semiconductor device, wherein the shallow device isolation region is formed of STI, comprises the steps of:

forming a first film on the semiconductor substrate;

forming a first opening window in the first film;

forming a first isolation recess by partly etching the semiconductor substrate with the first film used as a mask;

forming a second film on the first film and the first isolation recess;

forming a second opening window in the second film;

partly etching the first film with the second film used as a mask;

forming a second isolation recess by partly etching the semiconductor substrate with the first film used as a mask; and filling the first isolation recess and the second isolation recess by depositing an insulating film on the first film, the first isolation recess and the second isolation recess.

According to the method for manufacturing a semiconductor device in the seventh aspect of the invention, the first film serves both as a mask for forming the first isolation recess and as a mask for forming the second isolation recess. Therefore, the steps for fabricating device isolation regions of the semiconductor device can be reduced. Further, in the formation of the second isolation recess, the first isolation recess is also etched uniformly, thus eliminating the occurrence of unnecessary step gaps in the first isolation recess.

In one embodiment, the first film is a layer-stacked film of silicon oxide and silicon nitride, the second film is photoresist, and the insulating film is oxide.

According to this embodiment, the first film, which needs to function as a mask two times, is formed of a layer-stacked film resistant to ashing process or hydrofluorination process, while the second film, which needs to function as a mask only one time, is formed of photoresist that can be removed easily with ashing process. Therefore, the semiconductor device manufacturing method can be simplified.

BRIEF DESCRIPTION OF THE DRAWINGS

FIGS. 9A, 9B, 9C, 9D and 9E are views for explaining semiconductor devices using the device isolation regions of FIG. 8;

BEST MODE FOR CARRYING OUT THE INVENTION

Herein, the terms, "basic circuit block," refer to a set of devices having a common well region.

Also, herein, the terms, "first conductive type," refer to P type or N type. The terms, "second conductive type," refer to N type when the first conductive type is P type, or to P type when the first conductive type is N type.

Semiconductor substrates usable for the present invention, although not particularly limited, are preferably silicon substrates. The semiconductor substrate may have either conductive type, P-type or N-type.

Embodiment 1

Embodiment 1 of the present invention is described with reference to FIGS. 1, 2, 3A, 3B, 3C, 3D, 3E, 3F and 4.

Figure 1:
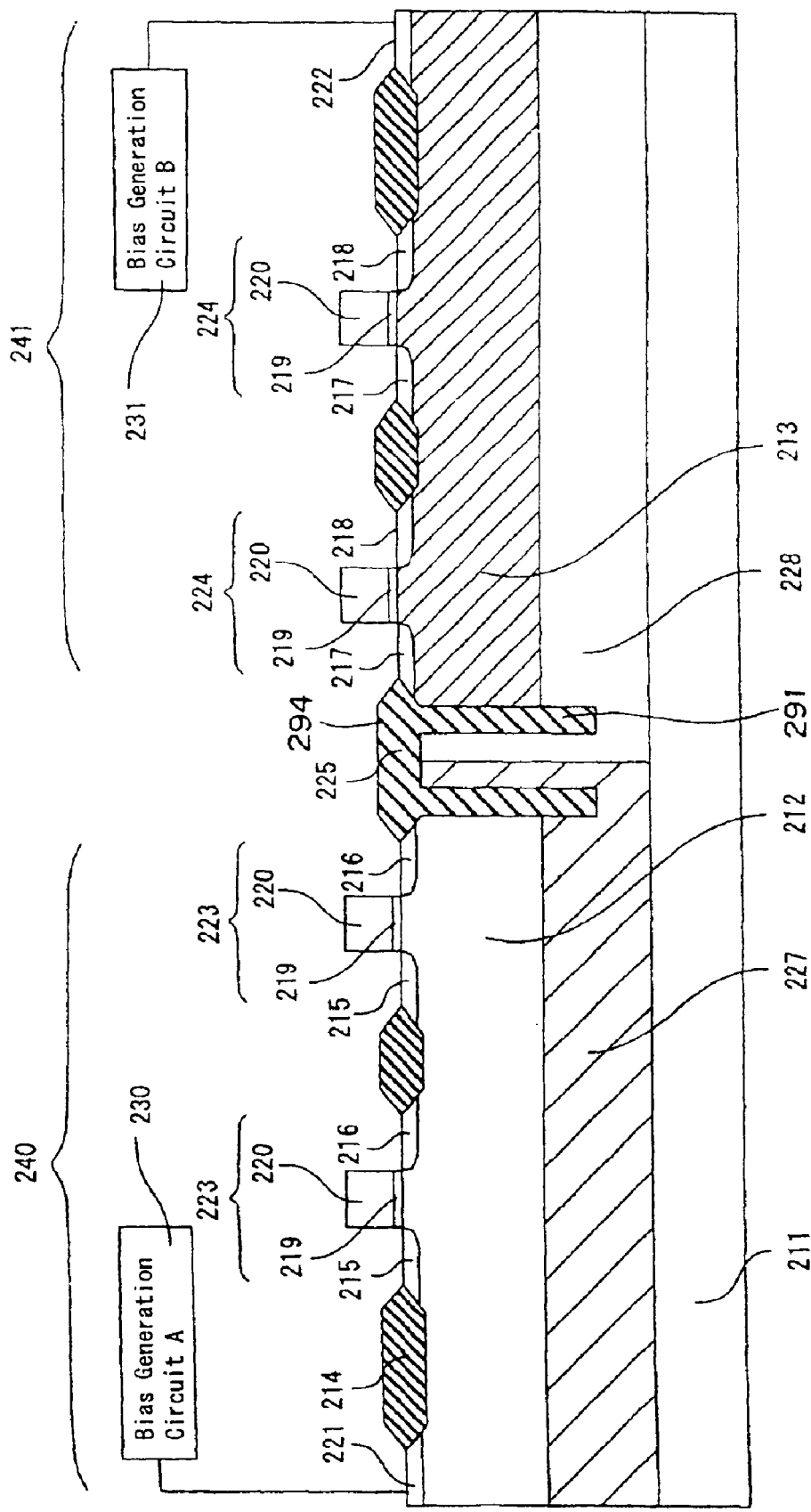
FIG. 1 is a schematic view showing a cross section of a semiconductor device according to Embodiment 1 of the present invention.
Figure 2:
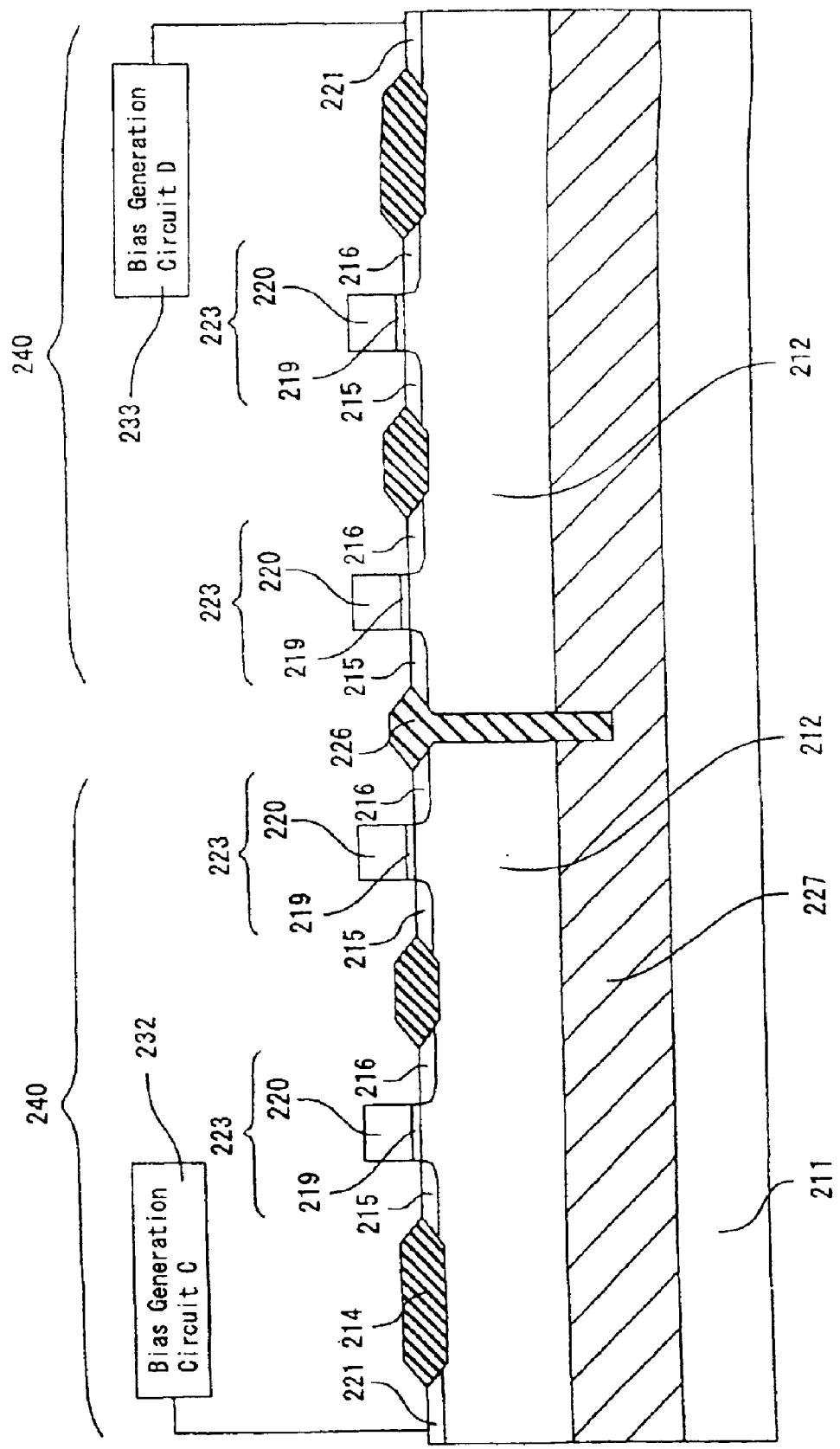
FIG. 2 is a schematic view showing a cross section of the semiconductor device in Embodiment 1 of the invention.

FIGS. 1 and 2 are schematic view each showing a cross section of a semiconductor device according to Embodiment 1 of the present invention. FIG. 1 shows a basic circuit block 240 composed of N-type substrate-bias variable transistors 223, 223, . . . , a basic circuit block 241 composed of P-type substrate-bias variable transistors 224, 224, . . . , and boundaries of these blocks. FIG. 2 shows two basic circuit blocks 240, 240 each composed of N-type substrate-bias variable transistors 223, 223, . . . , and a boundary of these blocks.

In the semiconductor device of this Embodiment 1, as shown in FIG. 1, an N-type deep well region 227 and a P-type deep well region 228 are formed in a semiconductor substrate 211.

A P-type shallow well region 212 is formed in the N-type deep well region 227. An N-type source region 215 and an N-type drain region 216 are formed in the P-type shallow well region 212. Also, on a channel region between the N-type source region 215 and the N-type drain region 216, a gate electrode 220 is formed via a gate insulator 219 to form an N-type substrate-bias variable transistor 223. A device isolation region 214 of LOCOS (Local Oxidation of Silicon) oxide is formed between mutually neighboring N-type substrate-bias variable transistors. This device isolation region 214 of LOCOS oxide isolates the N-type source region 215 and the N-type drain region 216, but does not isolate the P-type shallow well region 212. Therefore, a plurality of N-type substrate-bias variable transistors 223 share the P-type shallow well region 212, thus forming the basic circuit block 240 composed of N-type substrate-bias variable transistors.

An N-type shallow well region 213 is formed in the P-type deep well region 228. A P-type source region 217 and a P-type drain region 218 are formed in the N-type shallow well region 213. Also, on a channel region between the P-type source region 217 and the P-type drain region 218, a gate electrode 220 is formed via a gate insulator 219 to form a P-type substrate-bias variable transistor 224. Between mutually neighboring P-type substrate-bias variable transistors 224, 224 is a device isolation region 214 of LOCOS oxide. This device isolation region 214 of LOCOS oxide isolates the P-type source region 217 and the P-type drain region 218, but does not isolate the N-type shallow well region 213. Therefore, a plurality of P-type substrate-bias variable transistor 224 share the N-type shallow well region 213, thus forming the basic circuit block 241 composed of P-type substrate-bias variable transistors 224, 224.

In FIG. 1, a bias generation circuit A 230 is connected to the P-type shallow well region 212 via a region 221 of higher P-type dopant level. Also, a bias generation circuit B 231 is connected to the N-type shallow well region 213 via a region 222 of higher N-type dopant level. A composite device isolation region 225 formed of a composite composed of two deep device isolation regions 291 as boundary-portion device isolation regions and LOCOS oxide 294 is formed at a boundary between the basic circuit block 240 composed of N-type substrate-bias variable transistors 223, 223, . . . and the basic circuit block 241 composed of P-type substrate-bias variable transistors 224, 224, . . . . The depth of these deep device isolation regions 291 is so set as to electrically isolate the shallow well regions 212, 213. The composite device isolation region 225 formed of a composite of the two deep device isolation regions 291 and the LOCOS oxide 294 prevents punch-through between the P-type shallow well region 212 and the P-type deep well region 228 as well as punch-through between the N-type shallow well region 213 and the N-type deep well region 227. Thus, the basic circuit block 240 composed of N-type substrate-bias variable transistors 223, 223, . . . and the basic circuit block 241 composed of P-type substrate-bias variable transistors 224, 224, . . . are isolated from each other.

In FIG. 2, the P-type shallow well region 212 is segmented by a deep device isolation region 226 composed of one deep device isolation region and LOCOS oxide. A bias generation circuit C 232 and a bias generation circuit D 233 are connected to the segmented P-type shallow well regions 212, respectively, via the region 221 of higher P-type doping level. Thus, the basic circuit block 240 composed of N-type substrate-bias variable transistors 223, 223, . . . is isolated into two. These circuit blocks can be operated as independent basic circuit blocks by applying independent well biases thereto from the bias generation circuit C 232 and the bias generation circuit D 233, respectively.

Next, the procedure for fabricating the semiconductor device shown in FIGS. 1 and 2 is described.

On the semiconductor substrate 211, the device isolation region 214 of LOCOS oxide, and the device isolation regions 225 and 226 each provided by a composite of a deep device isolation region and LOCOS oxide, are formed. The procedure for forming the device isolation regions is explained with reference to FIGS. 3A, 3B, 3C, 3D, 3E, 3F and 4.

Figure 3A:
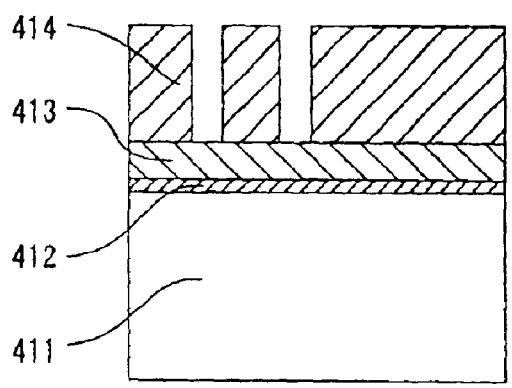
FIGS. 3A, 3B, 3C, 3D, 3E and 3F are views for explaining the procedure of forming a composite device isolation region in Embodiment 1.
Figure 3B:
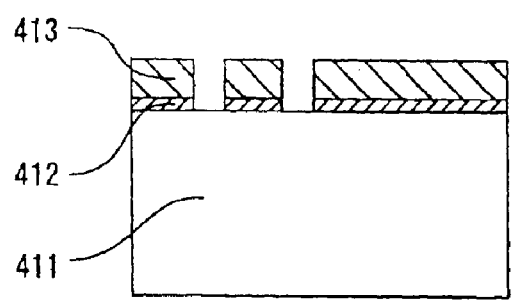
Figure 3C:
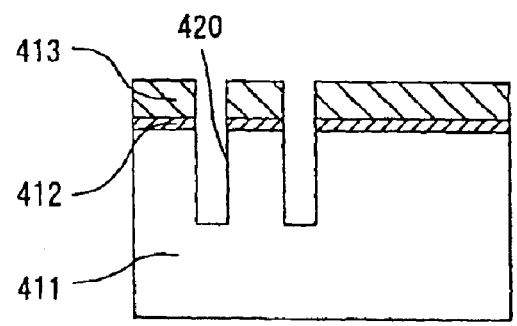
Figure 3D:
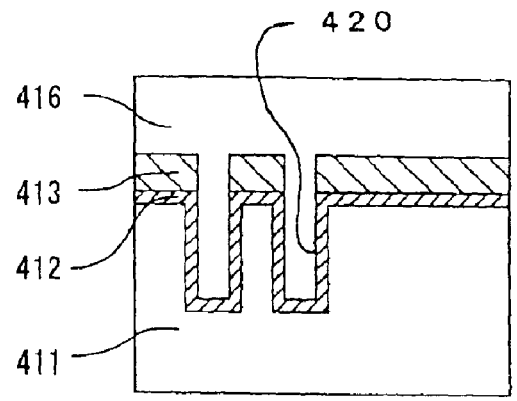
Figure 3E:
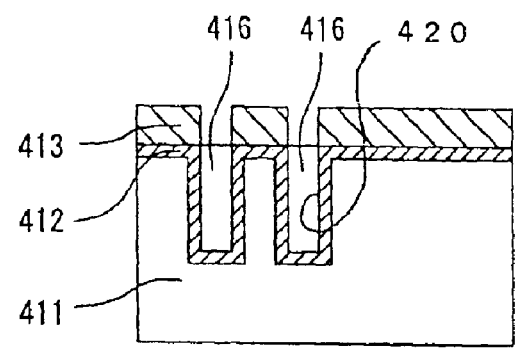
Figure 3F:
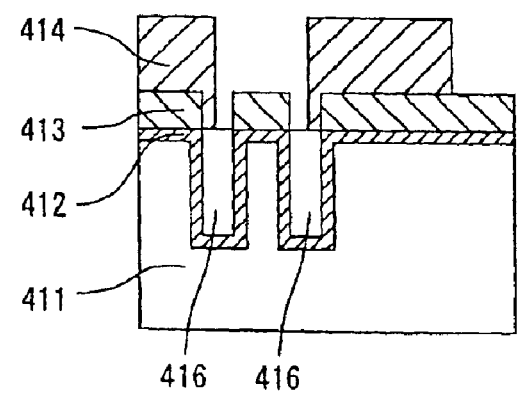
Figure 4A:
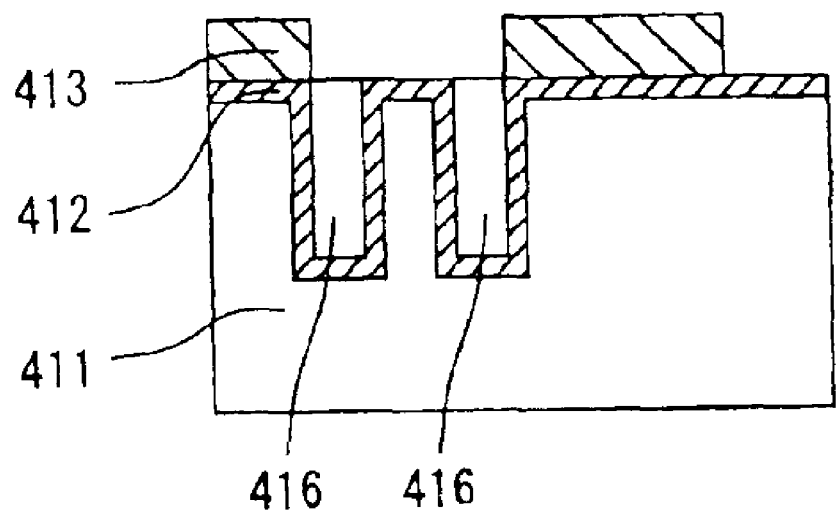
FIGS. 4A and 4B are views for explaining the procedure of forming a composite device isolation region in Embodiment 1.
Figure 4B:
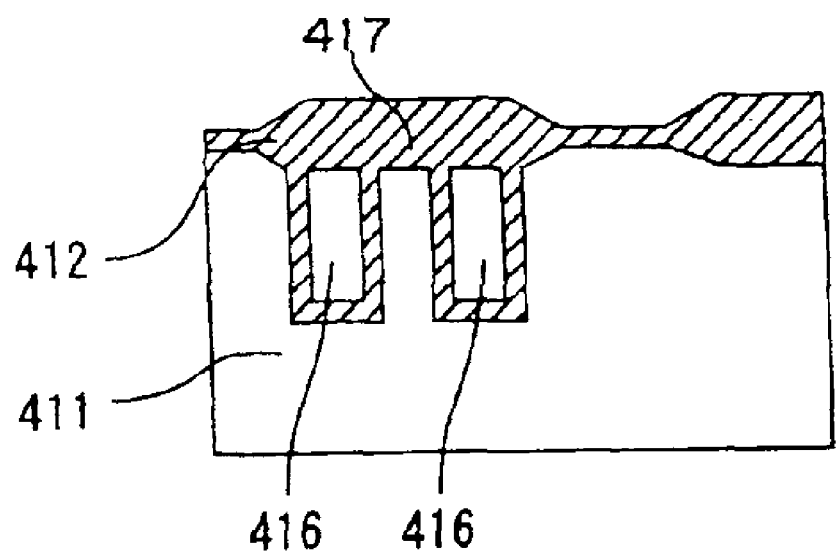

First, as shown in FIG. 3A, oxide 412 is formed on a semiconductor substrate 411. Next, a SiN film 413 is deposited by CVD (Chemical Vapor Deposition) process. The oxide 412 has both a role of serving as a buffer layer for avoiding direct contact of the SiN film 413 and the semiconductor substrate 411 and a role of serving as protective layer in removing the SiN film with phosphoric acid. Next, a patterning corresponding to the deep device isolation region is performed with photoresist 414. With the photoresist 414 used as a mask, the SiN film 413 and the oxide 412 are partly removed by reactive ion etching (RIE), and subsequently the photoresist 414 is removed (FIG. 3B). Then, with the SiN film 413 used as a mask, the semiconductor substrate 411 is partly removed by RIE to form a recess 420 (FIG. 3C). At this point, it is desirable to perform a thermal oxidation step to thereby oxidize side walls and bottom portion of the recess 420. By so doing, interfaces between dielectric portions of the device isolation region and the semiconductor substrate can be lessened in defects, which leads to an improvement in electrical characteristics of the device. Further, it is more desirable to perform not merely the thermal oxidation step but a sequence of steps of thermal oxidation, oxide removal and thermal oxidation. By so doing, it becomes possible to remove portions of more crystal defects that have occurred during the formation of device isolation regions, so that the interfaces between the dielectric portions of the device isolation regions and the semiconductor substrate can be lessened in defects, which leads to an improvement in the electrical characteristics of the device. Subsequently, as shown in FIG. 3D, a polysilicon film 416 is formed by CVD process. In this process, the recess 420 formed in the semiconductor substrate 411 is also filled with polysilicon. Material of this polysilicon film 416 may be not only polysilicon but also amorphous silicon or single crystal silicon or the like. The material of this polysilicon film 416 may be other than electrically conductive substances and provided by, for example, silicon oxide or silicon nitride or other insulating materials. Then, as shown in FIG. 3E, the polysilicon film 416 is etched back so that the polysilicon film 416 is left only in the recess. Then, as shown in FIG. 3F, a patterning corresponding to the device isolation region of LOCOS oxide is performed with the photoresist 414. Then, with the photoresist 414 used as a mask, the SiN film 413 is selectively and partly removed by reactive ion etching (RIE), and subsequently the photoresist 414 is removed (FIG. 4A). Then, a LOCOS oxidation step is performed. In places where the SiN film 413 is absent, LOCOS oxide 417 is selectively formed as shown in FIG. 4B. Device isolation regions are formed in the above-described procedure. The device isolation regions include two types of regions, one formed of only LOCOS oxide and the other formed of a composite of LOCOS oxide and a deep device isolation region. According to the above-described process, the SiN film 413 serves for two roles, one as a mask for forming the recess 420 and the other as a mask for selectively forming the LOCOS oxide 417. Therefore, two types of device isolation regions of different depths can be formed with relatively simple process.

Next, as shown in FIG. 1, the N-type deep well region 227 and the P-type deep well region 228 are formed on the semiconductor substrate 211. Dopant ions that give the N type are exemplified by $^{31}P^+$, and dopant ions that give the P type are exemplified by $^{11}B^+$. The deep well region can be formed, for example, under the conditions of an injection energy of 240 to 1500 keV and an injection quantity of $5\times10^{11}$ to $1\times10^{14}$ cm$^{-2}$ for the case where $^{31}P^+$ ions are used as dopant ions, or conditions of an injection energy of 100 to 1000 keV and an injection quantity of $5\times10^{11}$ to $1\times10^{14}$ cm$^{-2}$ for the case where $^{11}B^+$ ions are used as dopant ions.

A second-conductive-type shallow well region or a first-conductive-type shallow well region is formed on the first-conductive-type deep well region or the second-conductive-type deep well region, whichever is shallower as viewed from the substrate surface. More specifically, the P-type shallow well region 212 is formed on the N-type deep well region 227, and the N-type shallow well region 213 is formed on the P-type deep well region 228. Dopant ions that give the P type are exemplified by $^{11}B^+$, and dopant ions that give the N type are exemplified by $^{31}P^+$. The shallow well region can be formed, for example, under the conditions of an injection energy of 60 to 500 keV and an injection quantity of $5\times10^{11}$ to $1\times10^{14}$ cm$^{-2}$ for the case where $^{11}B^+$ ions are used as dopant ions, or conditions of an injection energy of 130 to 900 keV and an injection quantity of $5\times10^{11}$ to $1\times10^{14}$ cm$^{-2}$ for the case where $^{31}P^+$ ions are used as dopant ions. It is noted that the depth of the junction between the shallow well region and the deep well region is determined according to the injection conditions for the shallow well region, the injection conditions for the deep well region and the thermal processes to be performed afterwards as described above. The depth of the deep device isolation region is set to such a level that shallow well regions of its neighboring devices are electrically isolated. That is, the lower end of the deep device isolation region is made to be deeper than the junction between the deep well region and the shallow well region.

Further, in order to prevent the dopant level from being excessively lightened in the substrate surface region, dopant ions of the same conductive type as the dopant ions of the shallow well region may also be injected as a punch-through stopper injection into the shallow well region. The punch-through stopper injection can be carried out, for example, under the conditions of dopant ions of $^{11}B^+$, an injection energy of 10 to 60 keV and an injection quantity of $5\times10^{11}$ to $1\times10^{13}$ cm$^{-2}$ for the case of formation in the P-type shallow well, or conditions of dopant ions of $^{31}P^+$, an injection energy of 30 to 150 keV and an injection quantity of $5\times10^{11}$ to $1\times10^{13}$ cm$^{-2}$ for the case of formation in the N-type shallow well.

Next, the gate insulator 219 and the gate electrode 220 are formed in this order.

Material of the gate insulator 219 is not particularly limited as far as it has insulation property. For this purpose, when a silicon substrate is used, silicon oxide, silicon nitride or a laminate of those may be used. Further, high-permittivity films of aluminum oxide, titanium oxide, tantalum oxide or the like or their laminates may also be used. Preferably, the gate insulator 219 has a thickness of 1 to 10 nm in the case where silicon oxide is used. The gate insulator 219 can be formed by CVD process, sputtering process, thermal oxidation or other like process.

Next, material of the gate electrode 220 is not particularly limited as far as it has electrical conductivity. For this purpose, when a silicon substrate is used, silicon films of polysilicon, single crystal silicon or the like are exemplified. Further, in addition to these, metal films of aluminum, copper or the like are exemplified. Preferably, the gate electrode has a thickness of 0.1 to 0.4 $\mu$m in the case where silicon oxide is used. The gate electrode can be formed by CVD process, evaporation process or other like process.

Further, although not shown, a side wall spacer may be formed on the side wall of the gate electrode 220. Material of this side wall spacer is not particularly limited and exemplified by silicon oxide, silicon nitride and the like.

Next, a source region (NMOS source region 215 and PMOS source region 217) and a drain region (NMOS drain region 216 and PMOS drain region 218) of a conductive type opposite to the conductive type of the shallow well region are formed on the surface layer of the shallow well region.

The source regions 215, 217 and the drain regions 216, 218 can be formed in self-alignment fashion, for example, by injecting dopant ions of a conductive type opposite to the conductive type of the shallow well region with the gate electrode 220 used as a mask. The source regions 215, 217 and the drain regions 216, 218 can be formed, for example, under the conditions of an injection energy of 3 to 100 keV and an injection quantity of $1\times10^{15}$ to $1\times10^{16}$ cm$^{-2}$ for the case where $^{75}As^+$ ions are used as dopant ions, or conditions of an injection energy of 1 to 20 keV and an injection quantity of $1\times10^{15}$ to $1\times10^{16}$ cm$^{-2}$ for the case where $^{11}B^+$ ions are used as dopant ions. It is noted that the surface layer of the shallow well region under the gate electrode 220 functions as a channel region.

Further, although not shown, the source regions 215, 217 and the drain regions 216, 218 may have an LDD (Lightly Doped Drain) region on their gate electrode 220 side. The LDD region can be formed in self-alignment fashion, for example, by injecting dopant ions of a conductive type opposite to the conductive type of the shallow well region with the gate electrode 220 used as a mask. In this case, the source regions and the drain regions can be formed in self-alignment fashion by, after the formation of the LDD region, forming the side wall spacer on the side wall of the gate electrode and injecting ions with the gate electrode and the side wall spacer used as masks. The LDD injection can be implemented, for example, under the conditions of an injection energy of 3 to 100 keV and an injection quantity of $5\times10^{13}$ to $1\times10^{15}$ cm$^{-2}$ for the case where $^{75}As^+$ ions are used as dopant ions, or conditions of an injection energy of 1 to 20 keV and an injection quantity of $1\times10^{13}$ to $5\times10^{14}$ cm$^{-2}$ for the case where $^{11}B^+$ ions are used as dopant ions.

In addition, as the dopant ions for forming the source region, the drain region and the LDD region, it is also possible to use $^{31}P^+$ ions, $^{122}Sb^+$ ions, $^{115}In^+$ ions, $^{49}BF_2^+$ ions or the like, in addition to the above-mentioned $^{11}B^+$ ions and $^{75}As^+$ ions.

Further, the source regions 215, 217, the drain regions 216, 218 and the gate electrode 220 have their surface layers silicified with a view to lowering their respective resistances and improving their electrical conductivities with their respective connecting lines.

After that, an activation annealing for the dopants is performed. The activation annealing is carried out under such conditions that the dopants are fully activated and moreover prevented from being excessively diffused. For example, in the case where the N-type dopant is $^{75}As^+$ and the P-type dopant is $^{11}B^+$, it is appropriate that after the injection of $^{75}As^+$, an annealing is done at 800 to 1000° C. for about 10 to 100 minutes and subsequently, after the injection of $^{11}B^+$, an annealing is done at 800 to 1000° C. for 10 to 100 seconds. In addition, in order to obtain a gentler dopant profile for the shallow well region and the deep well region, another annealing may be performed before injecting dopants for the source region and the drain region.

After that, interconnecting lines and the like are formed by known techniques, and thus the semiconductor device can be formed.

Although the above description has been made on a case where only the substrate-bias variable transistors 223, 224 are involved for explanation's sake, it is also possible that MOSFETs of normal structure are mixed. In this case, the voltage for the shallow well regions may appropriately be fixed for devices that are to be formed into normal MOSFETs.

According to the semiconductor device of the above Embodiment 1, using the device isolation region 214 formed of only LOCOS oxide within one circuit block allows the shallow well region 212 or 213 to be commonized within the circuit blocks 240, 241. Meanwhile, isolating the shallow well regions 212, 213 by the deep device isolation regions 225, 226 and the deep well regions 227, 228 allows the independent shallow well regions 212, 212, . . . , 213, 213, . . . to be easily formed in plurality. Therefore, it becomes possible to apply different well biases to a plurality of shallow well regions 212, 213, respectively. As a result of this, it becomes implementable to provide a plurality of circuit blocks 240, 240, . . . , 241, 241 on one substrate 211. Consequently, it becomes implementable to properly divide the circuits into active-state circuits and standby-state circuits, thus making it possible to suppress useless power consumption to a minimum while maintaining the high-speed operation of the circuits.

Moreover, the combinational use of the shallow device isolation region 214 and the deep device isolation region 225 allows the isolation of the well regions to be achieved with smaller margin than in the prior-art device isolation process. For example, as shown in FIG. 2, two basic circuit blocks 240, 240 can easily be isolated from each other by one deep device isolation region 226. Thus, a semiconductor device of higher integration can be realized.

According to Embodiment 1 as described above, an integrated circuit including substrate-bias variable transistors capable of high-speed operation, low-power-consumption operation and high integration is provided.

Embodiment 2

Embodiment 2 of the present invention is described with reference to FIGS. 5, 6A, 6B, 6C, 6D, 6E, 6F, 7A, 7B, 8, 9A, 9B, 9C, 9D and 9E.

Figure 5:
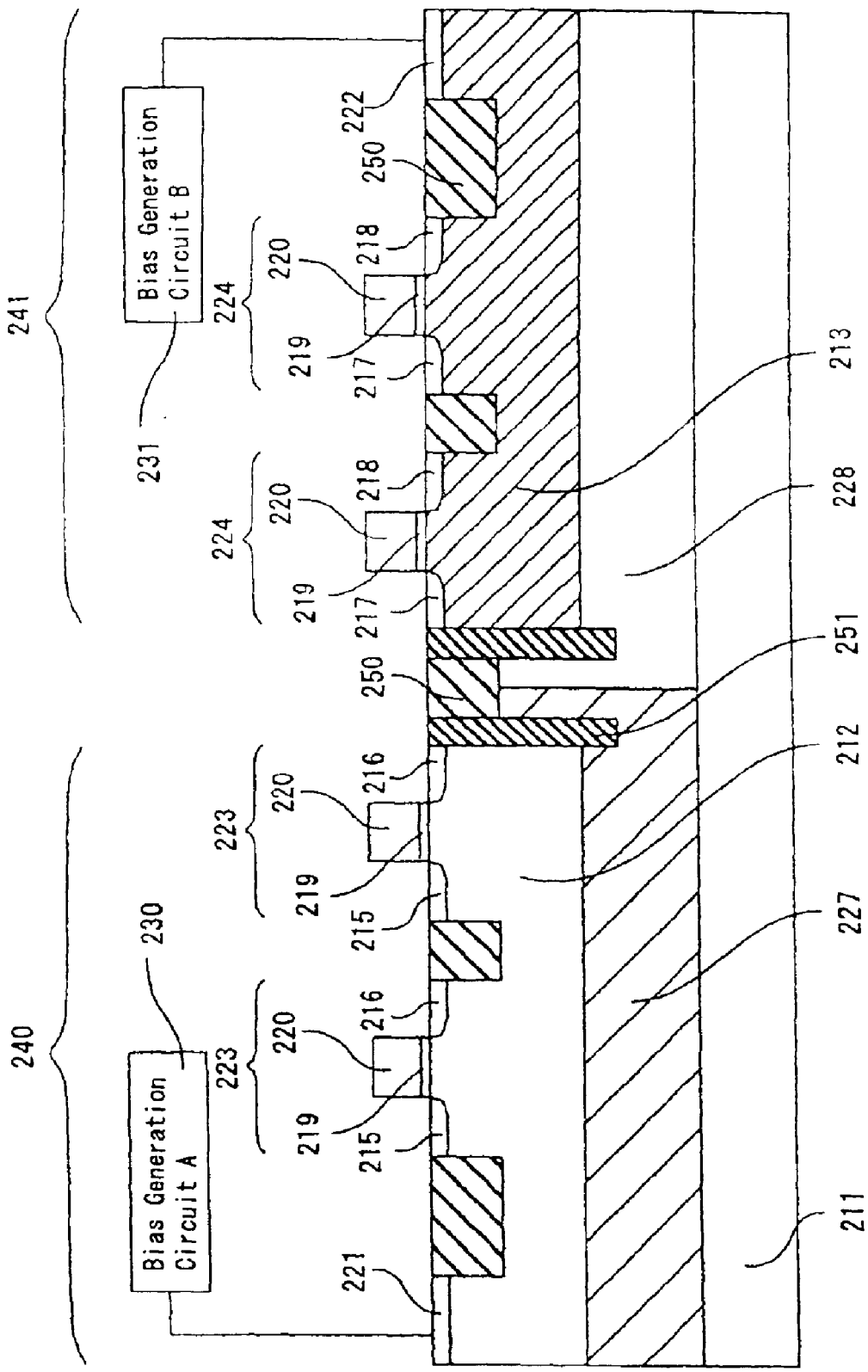
FIG. 5 is a schematic view showing a cross section of a semiconductor device according to Embodiment 2 of the present invention.

FIG. 5 is a schematic view of a cross section of a semiconductor device which is Embodiment 2 of the present invention, showing a basic circuit block 240 composed of N-type substrate-bias variable transistors 223, a basic circuit block 241 composed of P-type substrate-bias variable transistors 224 and a boundary of these blocks.

The semiconductor device of this Embodiment 2 differs from the semiconductor device of the foregoing Embodiment 1 in the structure of the device isolation region. More specifically, the device isolation region of this Embodiment 2 is composed of two types of device isolation regions different in depth from each other, the shallower device isolation region being formed of STI (Shallow Trench Isolation).

Substrate-bias variable transistors 223 or 224 present within one basic circuit block 240 or 241 are isolated from each other by a shallow device isolation region 250. The basic circuit block 240 composed of the N-type substrate-bias variable transistors 223 and the basic circuit block 241 composed of the P-type substrate-bias variable transistors 224 are isolated from each other by a device isolation region which is a composite of two deep device isolation regions 251 and the shallow device isolation region 250.

Next, the procedure for fabricating the semiconductor device shown in FIG. 5 is described. The procedure for fabricating the semiconductor device shown in FIG. 5 differs from the procedure for fabricating the semiconductor device of Embodiment 1 in the procedure for forming device isolation regions.

Figure 6A:
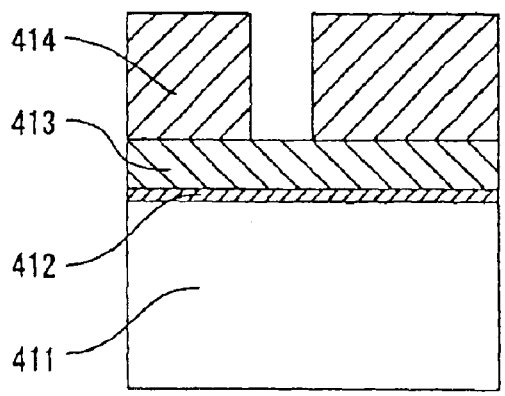
FIGS. 6A, 6B, 6C, 6D, 6E and 6F are views for explaining the procedure of forming a device isolation region.
Figure 6D:
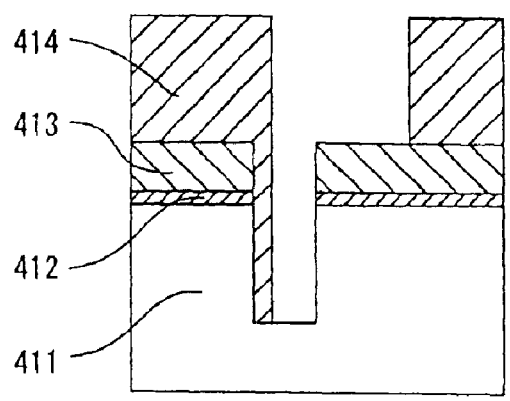
Figure 6B:
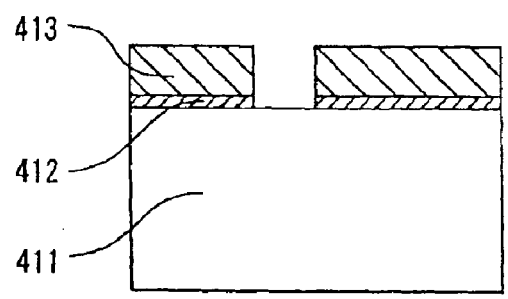
Figure 6E:
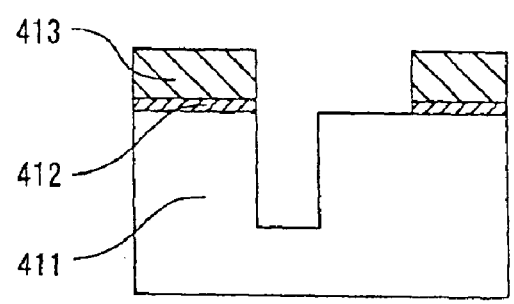
Figure 6C:
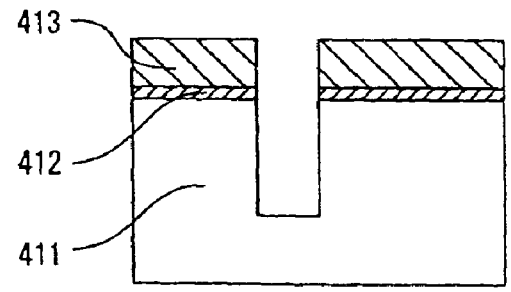
Figure 6F:
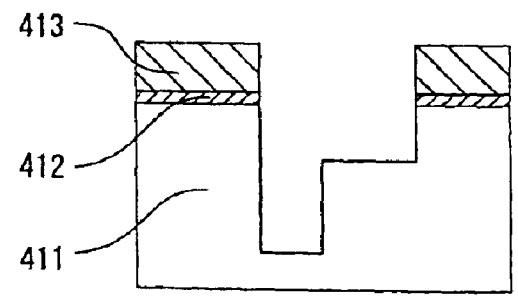
Figure 7A:
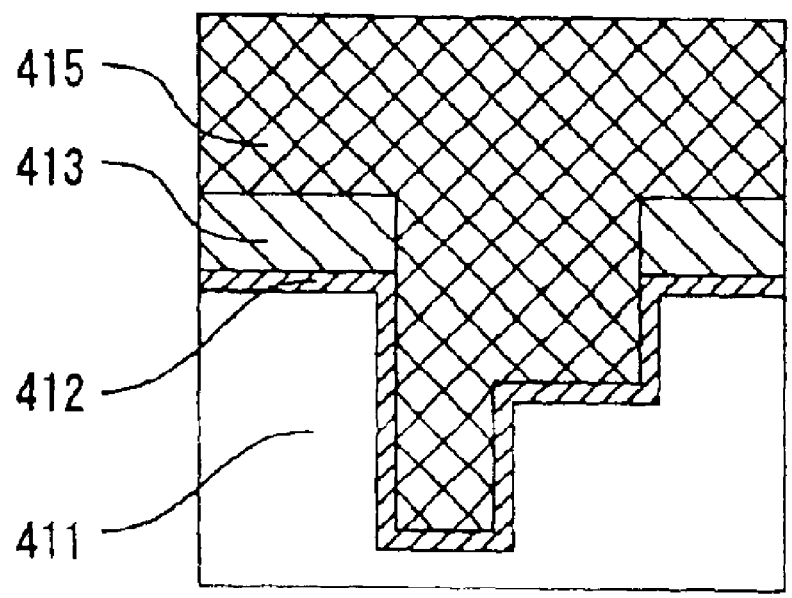
FIGS. 7A and 7B are views for explaining the procedure of forming a device isolation region.
Figure 7B:
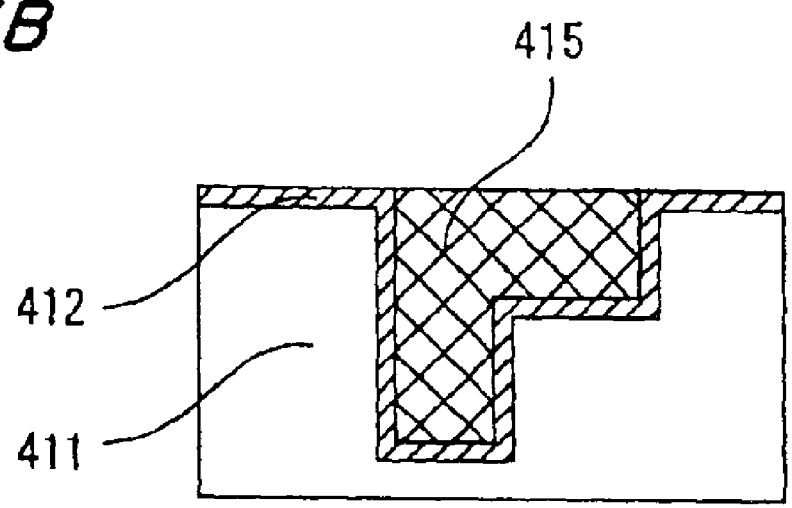

The procedure for fabricating device isolation regions is described with reference to FIGS. 6A, 6B, 6C, 6D, 6E, 6F, 7A and 7B. First, as shown in FIG. 6A, oxide 412 is formed on a semiconductor substrate 411. Next, a SiN film 413 is deposited by CVD process. The oxide 412 has both a role of serving as a buffer layer for avoiding direct contact of the SiN film 413 and the semiconductor substrate 411 and a role of serving as protective layer in removing the SiN film with phosphoric acid. Next, a patterning corresponding to the deep device isolation region is performed with photoresist 414. With the photoresist 414 used as a mask, the SiN film 413 and the oxide 412 are partly removed by reactive ion etching (RIE), and subsequently the photoresist 414 is removed (FIG. 6B). Then, with the SiN film 413 used as a mask, the semiconductor substrate 411 is partly removed by RIE to form a recess (FIG. 6C). Subsequently, as shown in FIG. 6D, a patterning corresponding to the shallow device isolation region is performed with the photoresist 414. With the photoresist 414 used as a mask, the SiN film 413 and the oxide 412 are selectively and partly removed by RIE, and subsequently the photoresist 414 is removed (FIG. 6E). Then, with the SiN film 413 used as a mask, the semiconductor substrate 411 is partly removed by RIE. At this stage, two types of recesses having different depths are formed in the semiconductor device (FIG. 6F). At this point, it is desirable to perform a thermal oxidation step to thereby oxidize side walls and bottom portion of the device isolation region. By so doing, interfaces between dielectric portions of the device isolation region and the semiconductor substrate can be lessened in defects, which leads to an improvement in electrical characteristics of the device. Further, it is more desirable to perform not merely the thermal oxidation step but a sequence of steps of thermal oxidation, oxide removal and thermal oxidation. By so doing, it becomes possible to remove portions of more crystal defects that have occurred during the formation of device isolation regions, so that the interfaces between the dielectric portions of the device isolation regions and the semiconductor substrate can be lessened in defects, which leads to an improvement in the electrical characteristics of the device. Subsequently, as shown in FIG. 7A, oxide 415 is formed by CVD process. In this process, the recesses formed in the semiconductor substrate 411 are also filled with the oxide 415. The formation of this oxide 415 is, preferably, carried out in a two-step process, i.e., the process up to filling the deep recess is done under such general conditions as the oxide is uniformly formed on the bottom face and the side wall, and then another process for filling the shallow recess is done under such conditions as oxide is less likely to be formed on the side wall (which conditions can be implemented, for example, with equipment using HDP (High Density Plasma)). By so doing, these recesses are filled with a smaller thickness of oxide, making it possible to suppress variations in film thickness in the subsequent CMP (Chemical Mechanical Polishing) process. Subsequently, the oxide 415 is polished by CMP process, and the SiN film 413 is removed, thus the device isolation region being completed (FIG. 7B).

In the above-described procedure, the SiN film 413 and the oxide 412 serve both as a mask for forming the deep recess and as a mask for forming the shallow recess. Therefore, the process is simplified. Further, in the formation of the shallow recess by etching, the previously formed deep recess is also etched uniformly, thus eliminating the occurrence of unnecessary step gaps in the deep recess.

Figure 8:
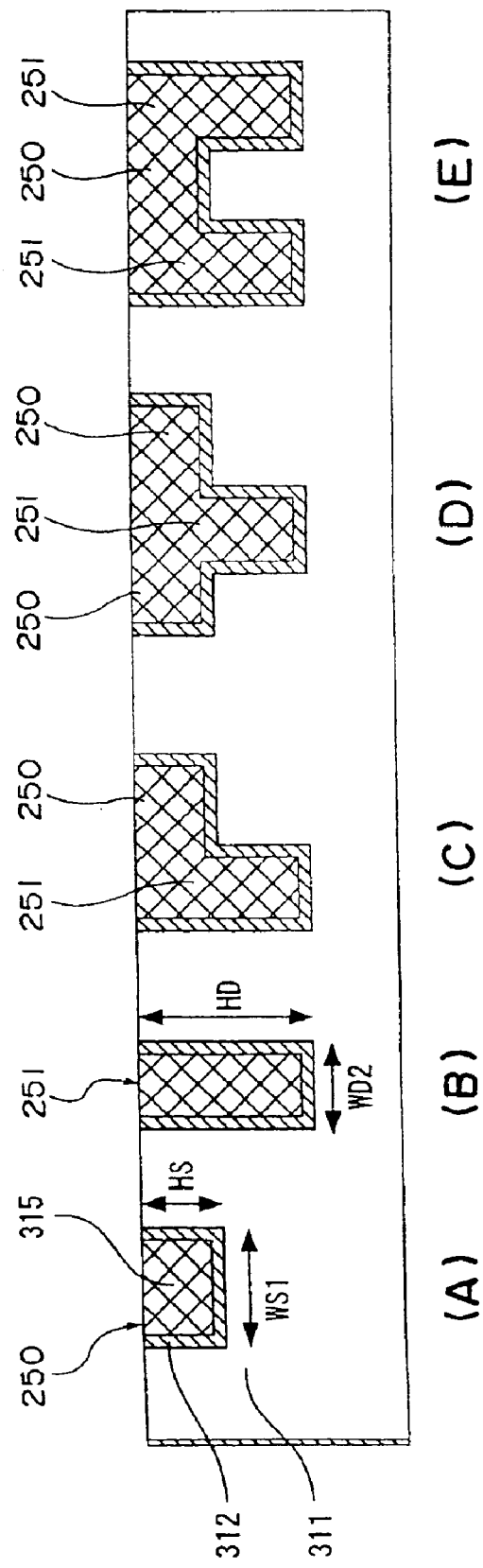
FIG. 8 is a view for explaining various device isolation regions.

The shallow device isolation region and the deep device isolation region can be formed either singly or in combination. FIG. 8 shows examples of combinations of typical device isolation regions. Further, FIGS. 9A, 9B, 9C, 9D and 9E show application examples of combinations of the respective device isolation regions.

A view (A) in FIG. 8 shows an example in which the shallow device isolation region 250 is formed singly. A depth HS of this shallow device isolation region 250 is preferably set to such a depth that, as shown in FIG. 9A, the source region 215 and the drain region 216 are isolated while the shallow well region 212 is not isolated, where the depth HS may be set to 0.1 to 0.5 μm, for example. A width WS1 of the shallow device isolation region is set so that the source region and the drain region of neighboring devices are sufficiently electrically isolated. Therefore, the width WS1 of the shallow device isolation region 250 is preferably set to, for example, 0.05 μm or more. The device isolation region 250 of the type shown at (A) in FIG. 8, which involves no segmentation of the shallow well region 212, is suitable for device isolation between those devices in which the shallow well may be common (e.g., between normal MOSFETs of identical type, or between substrate-bias variable transistors of identical type present within the same basic circuit block). Otherwise, the device isolation region 250 may also be provided at interconnect portions of the gate electrode or the like for use of reducing the electrostatic capacity between gate region and well region.

A view (B) in FIG. 8 shows an example in which the deep device isolation region 251 is formed singly. A depth HD of this deep device isolation region 251 is desirably set to such a depth that the shallow well region 212 shown in FIG. 9B is electrically isolated while the deep well region 227 is not isolated, where the depth HD may be set to 0.3 to 2 μm, for example. Also, a ratio HD/WD2 of depth HD to width WD2 of the deep device isolation region 251, if too large, would cause an obstacle in filling the oxide 315. Accordingly, preferably, the width WD2 of the deep device isolation region 251 is set to, for example, 0.06 μm or more, and the ratio HD/WD2 of depth HD to width WD2 of the deep device isolation region 251 is not more than 5. The deep device isolation region 251 of a type shown at (B) in FIG. 8 is capable of isolating the shallow well region 212 shown in FIG. 9B at a minimum device isolation width. Accordingly, the device isolation region is suitable for isolation between basic circuit blocks composed of substrate-bias variable transistors of identical type.

A view (C) in FIG. 8 shows an example in which the shallow device isolation region 250 is formed on one side of the deep device isolation regions 251. The device isolation region of this type is suitable for cases, as shown in FIG. 9C, where the deep well region 227 is common but the shallow well regions 212, 213 are different in conductive type from each other with the device isolation regions 251, 250 interposed therebetween, and moreover a MOSFET is present only on one side on which the shallow device isolation region 250 is present. Such a structure can be used, for example, in the case where a terminal for giving a voltage to the deep well 227 is provided. Dopants for forming the shallow well region 213 on the side on which no MOSFET is present would spread laterally in injection process and diffuse by annealing so as to reach the channel region of the MOSFET, causing a variation in threshold value. For prevention of this variation in threshold value, the shallow device isolation region 250 is provided on the side on which the MOSFET is present. Meanwhile, some changes in dopant level would have no influences on the side on which no MOSFET is present, so that the shallow device isolation region does not need to be provided.

In FIG. 9C, it is also allowable to provide merely a large-width deep device isolation region. However, providing a shallow device isolation region 250 on one side of the deep device isolation region 251 as in FIG. 9C facilitates the filling of oxide. This makes it relatively easier to form the large-width device isolation region. With the use of the constitution of FIG. 9C, it becomes implementable to effectively isolate the shallow well region with less device isolation margin, and therefore to suppress changes in threshold value of MOSFETs.

A view (D) in FIG. 8 shows an example in which the shallow device isolation regions 250, 250 are formed on both sides of the deep device isolation region 251. The device isolation region of this type is suitable for cases, as shown in FIG. 9D, where the deep well region 227 is common but the shallow well regions 212, 213 are different in conductive type from each other with the device isolation regions interposed therebetween, and moreover MOSFETs are present on both sides. In such a structure, the shallow well region 213 can be made common with another shallow well region 213 present at another place through the deep well region 227. In this case, for example, a plurality of field effect transistors present on the common shallow well region 213 may be provided by normal field effect transistors or by one circuit block composed of substrate-bias variable transistors. At such a boundary as shown in FIG. 9D, dopants forming the shallow well region would reach the shallow well regions which are opposite in conductive type to each other, incurring variations in the threshold value of MOSFETs. In order to prevent these variations in threshold value, shallow device isolation regions 250, 250 are provided on both sides of the deep device isolation region 251.

In FIG. 9D, it is also allowable to provide merely a large-width deep device isolation region. However, providing shallow device isolation regions 250 on both sides of the deep device isolation region 251 as in FIG. 9D facilitates the filling of oxide. This makes it relatively easier to form the large-width device isolation region. With the use of the constitution of FIG. 9D, it becomes implementable to effectively isolate the shallow well region with less device isolation margin, and therefore to suppress changes in threshold value of MOSFETs.

A view (E) in FIG. 8 shows an example in which the deep device isolation regions 251, 251 are formed on both sides of the shallow device isolation region 250. The device isolation region of this type is suitable for cases, as shown in FIG. 9E, where the deep well regions 227, 228 on both sides of the device isolation region are different in conductive type from each other. Such a structure is suitable for isolation between, for example, a basic circuit block composed of N-type substrate-bias variable transistors and a basic circuit block composed of P-type substrate-bias variable transistors.

In FIG. 9E, it is also allowable to provide merely a large-width deep device isolation region. However, providing deep device isolation regions 251 on both sides of the shallow device isolation region 250 as in FIG. 9E facilitates the filling of oxide. This makes it relatively easier to form the large-width device isolation region. With the use of the constitution of FIG. 9E, by virtue of the presence of the deep device isolation regions 251, 251 on both sides, it becomes implementable to effectively prevent punch-throughs between the N-type deep well region 227 and the N-type shallow well region 213, or between the P-type deep well region 228 and the P-type shallow well region 212, in FIG. 9E. Therefore, the basic circuit block composed of N-type substrate-bias variable transistors and the basic circuit block composed of P-type substrate-bias variable transistors can effectively be isolated from each other with less device isolation margin.

According to the semiconductor device of the above Embodiment 2, shallow well regions 212, 213 can be commonized within the circuit block 240 or 241 by using the shallow device isolation region 250 formed of STI within one circuit block 240 or 241. Meanwhile, by isolating the shallow well regions 212, 213 by the deep device isolation region 251 and the deep well regions 227, 228, a plurality of independent shallow well regions 212, 213 can easily be formed. Accordingly, different well biases can be applied to the plurality of shallow well regions 212, 213, respectively. This makes it possible to provide a plurality of basic circuit blocks 240, 241 on one substrate. Consequently, it becomes implementable to properly divide the circuits into active-state circuits and standby-state circuits, thus making it possible to suppress useless power consumption to a minimum while maintaining the high-speed operation of the circuits.

Moreover, the combinational use of the shallow device isolation region 250 and the deep device isolation region 251 allows the isolation of the well regions 212, 213 to be achieved with smaller margin than in the prior art device isolation process. Further, the use of STI as the shallow device isolation region 250 eliminates noticeable bird's beaks as would be seen in LOCOS oxide. Accordingly, the margin required for device isolation can be further reduced as compared with Embodiment 1.

Thus, according to Embodiment 2 described above, an integrated circuit including substrate-bias variable transistors capable of high-speed operation, low-power-consumption operation and high integration is provided.

Embodiment 3

Embodiment 3 of the present invention is explained with reference to FIG. 10 as follows.

Figure 10:
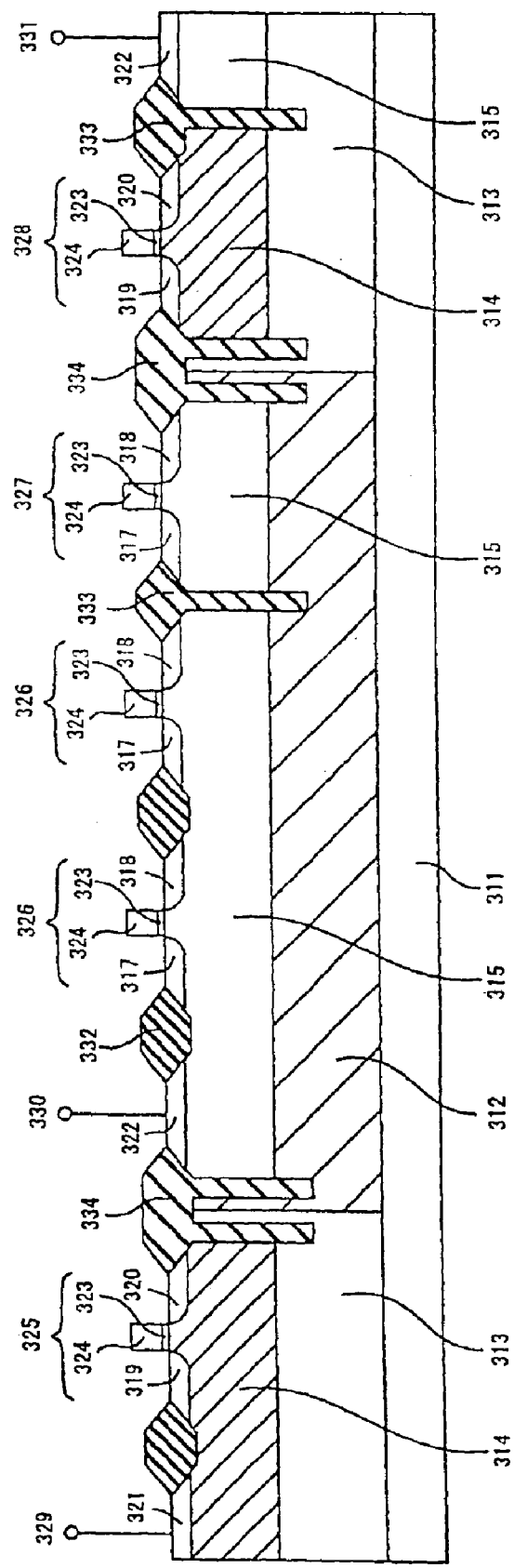
FIG. 10 is a schematic view showing a cross section of a semiconductor device according to Embodiment 3 of the invention.

FIG. 10 is a schematic view of a cross section of a semiconductor device which is Embodiment 3 of the invention, showing a basic circuit block composed of N-type substrate-bias variable transistors 326, a basic circuit block composed of P-type substrate-bias variable transistors 325, an N-type DTMOS 327, a P-type DTMOS 328 and boundaries of these.

In the semiconductor device of this Embodiment 3, an N-type deep well region 312 and a P-type deep well region 313 are formed in the semiconductor substrate 311.

A P-type shallow well region 315 is formed in an N-type deep well region 312. An N-type source region 317 and an N-type drain region 318 are formed on the P-type shallow well region 315. Also, a gate electrode 324 is formed via a gate insulator 323 on a channel region between the N-type source region 317 and the N-type drain region 318, by which an N-type substrate-bias variable transistors 326 and an N-type DTMOS 327 are made up. A device isolation region 332 of LOCOS oxide is formed between mutually neighboring N-type substrate-bias variable transistors 326, 326. This device isolation region 332 of LOCOS oxide isolates the N-type source region 317 and the N-type drain region 318, but does not isolate the P-type shallow well region 315. Therefore, a plurality of N-type substrate-bias variable transistors 326, 326, . . . share the P-type shallow well region 315, thus forming one basic circuit block. A well bias input 330 for the N-type substrate-bias variable transistors 326, 326, . . . is connected to the common P-type shallow well region 315 via a region 322 of higher P-type dopant level. Meanwhile, a device isolation region 333 formed of a composite of one deep device isolation region and LOCOS oxide is formed between mutually neighboring N-type DTMOS' 327, 327 and between N-type DTMOS 327 and N-type substrate-bias variable transistor 326. This device isolation region 333 formed of a composite of one deep device isolation region and LOCOS oxide is set to such a depth as to electrically isolate the P-type shallow well region 315, so that changes in the voltage of the P-type shallow well region 315 does not affect other P-type shallow well regions 315. The reason why the DTMOS 327 necessarily needs to have the shallow well region 315 independent from device to device is that changes in the voltage of the gate electrode 324 transfer to the shallow well region 315. In addition, although not shown, an N-type shallow well region is also formed in the N-type deep well region 312, and a terminal for fixing the bias of the N-type deep well region is formed via a region of higher N-type dopant level.

An N-type shallow well region 314 is formed in the P-type deep well region 313. A P-type source region 319 and a P-type drain region 320 are formed on the N-type shallow well region 314. Also, a gate electrode 324 is formed via a gate insulator 323 on a channel region between the P-type source region 319 and the P-type drain region 320, by which a P-type substrate-bias variable transistors 325 and a P-type DTMOS 328 are made up. A device isolation region 332 of LOCOS oxide is formed between mutually neighboring P-type substrate-bias variable transistors 325, 325. This device isolation region 332 of LOCOS oxide isolates the P-type source region 319 and the N-type drain region 320, but does not isolate the N-type shallow well region 314. Therefore, a plurality of P-type substrate-bias variable transistors 325 share the N-type shallow well region 314, thus forming one basic circuit block. A well bias input 329 for the P-type substrate-bias variable transistors 325, 325 is connected to the common N-type shallow well region 314 via a region 321 of higher N-type dopant level. Meanwhile, although not shown, a device isolation region 333 formed of a composite of one deep device isolation region and LOCOS oxide is formed between mutually neighboring P-type DTMOS' 328, 328 and between P-type DTMOS 328 and P-type substrate-bias variable transistor 325. This deep device isolation region 333 is set to such a depth as to electrically isolate the N-type shallow well region 314, so that changes in the voltage of the N-type shallow well region 314 does not affect other N-type shallow well regions 314. The reason why the DTMOS 328 necessarily needs to have the shallow well region 314 independent from device to device is that changes in the voltage of the gate electrode 324 transfer to the shallow well region 314. In addition, a P-type shallow well region 315 is also formed in the P-type deep well region 313, and a terminal 331 for fixing the bias of the P-type deep well region 313 is formed via a region 322 of higher P-type dopant level.

A device isolation region 334 formed of a composite of two deep device isolation regions and LOCOS oxide is provided for device isolation of boundaries of deep well regions different in polarity from each other. An example of such boundaries is a boundary between a basic circuit block composed of N-type substrate-bias variable transistors 326 and a basic circuit block composed of P-type substrate-bias variable transistors 325.

Next, the procedure for fabricating the semiconductor device shown in FIG. 10 is described.

For the semiconductor device shown in FIG. 10, a step for short-circuiting the gate electrode of the DTMOS and the shallow well region is added to the procedure for fabricating the semiconductor device described in Embodiment 1. The step for short-circuiting the gate electrode and the shallow well region is performed by a known method (Japanese Patent Laid-Open Publication HEI 10-22462) after the formation of the gate electrode.

Although the above description has been made on a case where only the substrate-bias variable transistors 325, 326 and the DTMOS' 327, 328 are mixed for explanation's sake, it is also possible that MOSFETs of normal structure as well are mixed. In this case, the voltage for the shallow well regions may appropriately be fixed for devices that are to be formed into normal MOSFETs.

According to the semiconductor device of the above Embodiment 3, using the device isolation region formed of only LOCOS oxide within one circuit block allows the shallow well regions 314, 315 to be commonized within the circuit block. Meanwhile, isolating the shallow well regions 314, 315 by the deep device isolation regions 333, 334 and the deep well regions 312, 313 allows the independent shallow well regions 314, 315 to be easily formed in plurality. Therefore, it becomes possible to apply different well biases to a plurality of shallow well regions 314, 315, respectively. As a result of this, it becomes implementable to provide a plurality of circuit blocks on one substrate. Consequently, it becomes implementable to properly divide the circuits into active-state circuits and standby-state circuits, thus making it possible to suppress useless power consumption to a minimum while maintaining the high-speed operation of the circuits.

Further, according to the semiconductor device of the above Embodiment 3, the device isolation of DTMOS' is facilitated by the deep device isolation region. Accordingly, there is no need for using the three-layer well structure (N-type shallow well region/P-type deep well region/N-type deep well region), as would be involved in the prior art. Thus, the energy for dopant ion injection during the formation of the deep well regions can be lowered, so that crystal defects can be reduced. As a result of this, the annealing temperature for recovery of crystal defects can be lowered, so that the diffusion of dopant ions can be suppressed. Consequently, a device smaller in leak current due to crystal defects can be obtained, and moreover the margin required for boundaries of well regions can be reduced.

According to Embodiment 3 as described above, an integrated circuit including substrate-bias variable transistors and DTMOS' capable of high-speed operation, low-power-consumption operation and high integration is provided.

Embodiment 4

Embodiment 4 of the present invention is explained with reference to FIG. 11.

Figure 11:
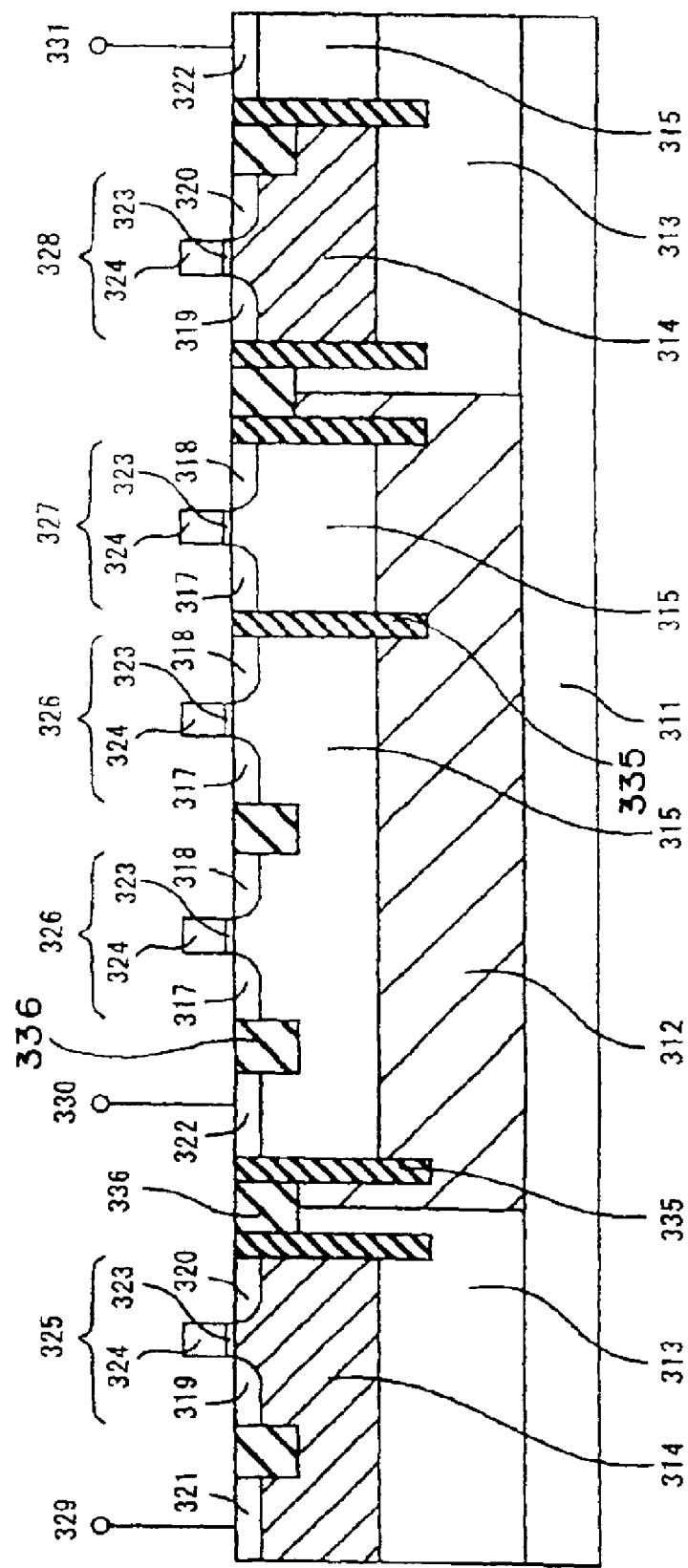
FIG. 11 is a schematic view showing a cross section of a semiconductor device according to Embodiment 4 of the invention.

FIG. 11 is a schematic view of a cross section of a semiconductor device which is Embodiment 4 of the present invention, showing a basic circuit block composed of N-type substrate-bias variable transistors 326, a basic circuit block composed of P-type substrate-bias variable transistors 325, an N-type DTMOS 327, a P-type DTMOS 328 and boundaries of these.

The semiconductor device of this Embodiment 4 differs from the semiconductor device of the foregoing Embodiment 3 in the structure of the device isolation region. More specifically, the device isolation region of this Embodiment 4 is composed of two types of device isolation regions different in depth from each other, the shallower device isolation region being formed of STI (Shallow Trench Isolation).

The device isolation region is formed of a shallow device isolation region 336, a deep device isolation region 335 or a composite of those. Which device isolation region is used is selected depending on the polarity of the shallow well region, the polarity of the deep well region and the presence or absence of a MOSFET on both sides of the device isolation region. As criteria of the selection, those described in paragraphs of Embodiment 2 (see FIGS. 8 and 9) are preferably used.

Next, the procedure for fabricating the semiconductor device shown in FIG. 11 is described. The procedure for fabricating the semiconductor device shown in FIG. 11 differs from the procedure for fabricating the semiconductor device of Embodiment 3 in the procedure for forming device isolation regions. The procedure for forming the device isolation region is the same as that described in the foregoing Embodiment 2 (FIGS. 3A, 3B, . . . , 3F, 4A and 4B).

Although the above description has been made on a case where only the substrate-bias variable transistors 325, 326 and the DTMOS' 327, 328 are mixed for explanation's sake, it is also possible that MOSFETs of normal structure as well are mixed. In this case, the voltage for the shallow well regions may appropriately be fixed for devices that are to be formed into normal MOSFETs.

According to the semiconductor device of the above Embodiment 4, using the device isolation region formed of the shallow device isolation region 336 within one circuit block allows the shallow well region 314 or 315 to be commonized within the circuit block. Meanwhile, isolating the shallow well regions 314, 315 by the deep device isolation region 335 and the deep well regions 312, 313 allows the independent shallow well regions 314, 315 to be easily formed in plurality. Therefore, it becomes possible to apply different well biases to a plurality of shallow well regions 314, 315, respectively. As a result of this, it becomes implementable to provide a plurality of circuit blocks on one substrate. Consequently, it becomes implementable to properly divide the circuits into active-state circuits and standby-state circuits, thus making it possible to suppress useless power consumption to a minimum while maintaining the high-speed operation of the circuits.

Further, according to the semiconductor device of the above Embodiment 4, the device isolation of the DTMOS' 327, 328 is facilitated by the deep device isolation region 335. Accordingly, there is no need for using the three-layer well structure (N-type shallow well region/P-type deep well region/N-type deep well region) for mixing the substrate-bias variable circuits 325, 326 and the DTMOS' 327, 328, as would be involved in the prior art. Thus, the energy for dopant ion injection during the formation of the deep well regions can be lowered, so that crystal defects can be reduced. As a result of this, the annealing temperature for recovery of crystal defects can be lowered, so that the diffusion of dopant ions can be suppressed. Consequently, a device smaller in leak current due to crystal defects can be obtained, and moreover the margin required for boundaries of well regions can be reduced.

Furthermore, according to the semiconductor device of the above Embodiment 4, there is no need for the margin corresponding to bird's beaks of LOCOS oxide, unlike the semiconductor device of the foregoing Embodiment 3. Accordingly, the area of the device isolation region can be suppressed smaller, allowing further higher integration.

According to Embodiment 4 as described above, an integrated circuit including substrate-bias variable transistors 325, 326 and DTMOS' 327, 328 capable of high-speed operation, low-power-consumption operation and high integration is provided.

Embodiment 5

Embodiment 5 of the present invention is explained with reference to FIGS. 12 to 15.

Embodiment 5 of the present invention is a semiconductor device as described in any one of Embodiments 1 to 4 in which source region and drain region of MOSFETs are formed in a stacked structure.

Figure 12:
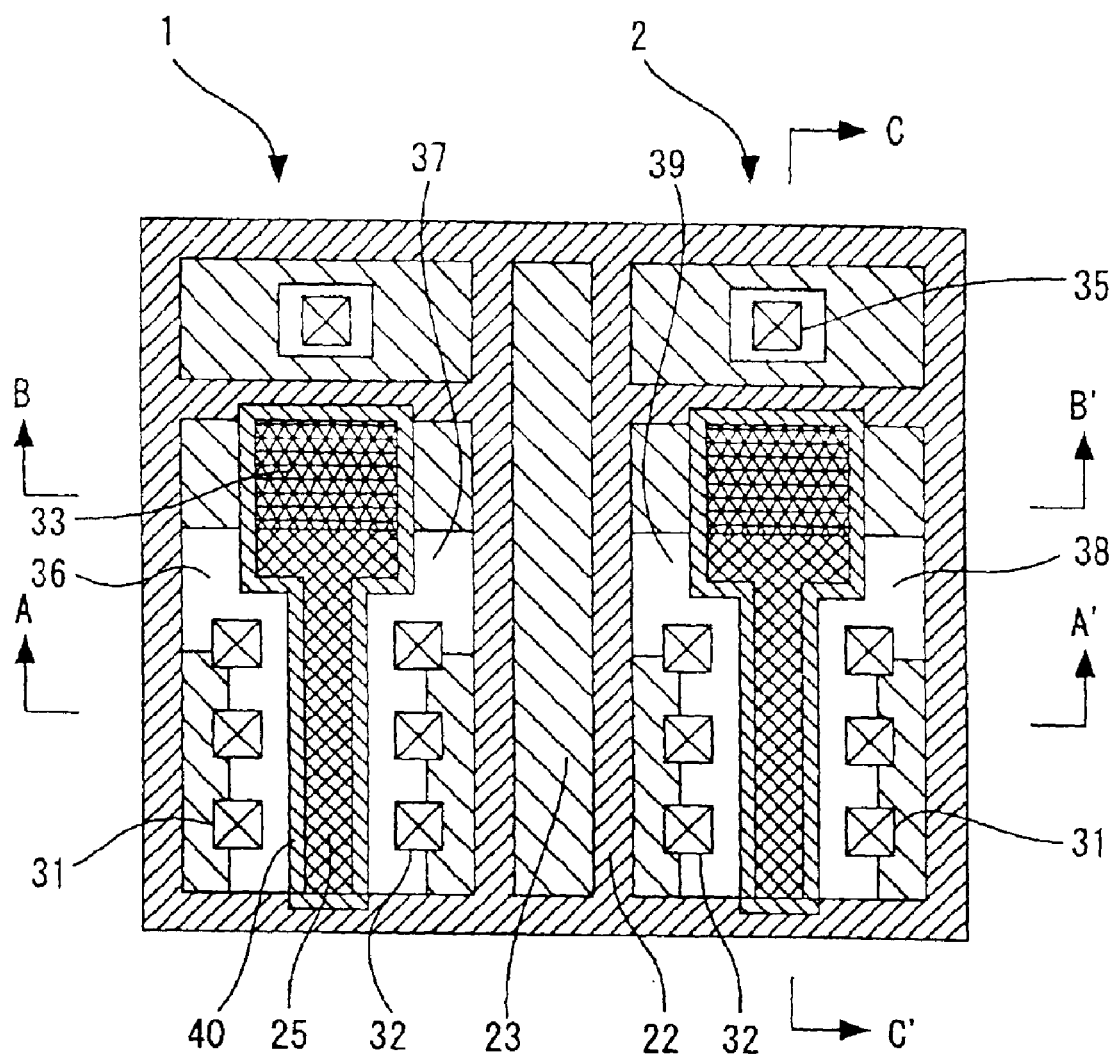
FIG. 12 is a plan view showing the structure of a MOSFET of a semiconductor device according to Embodiment 5 of the present invention.
Figure 13:
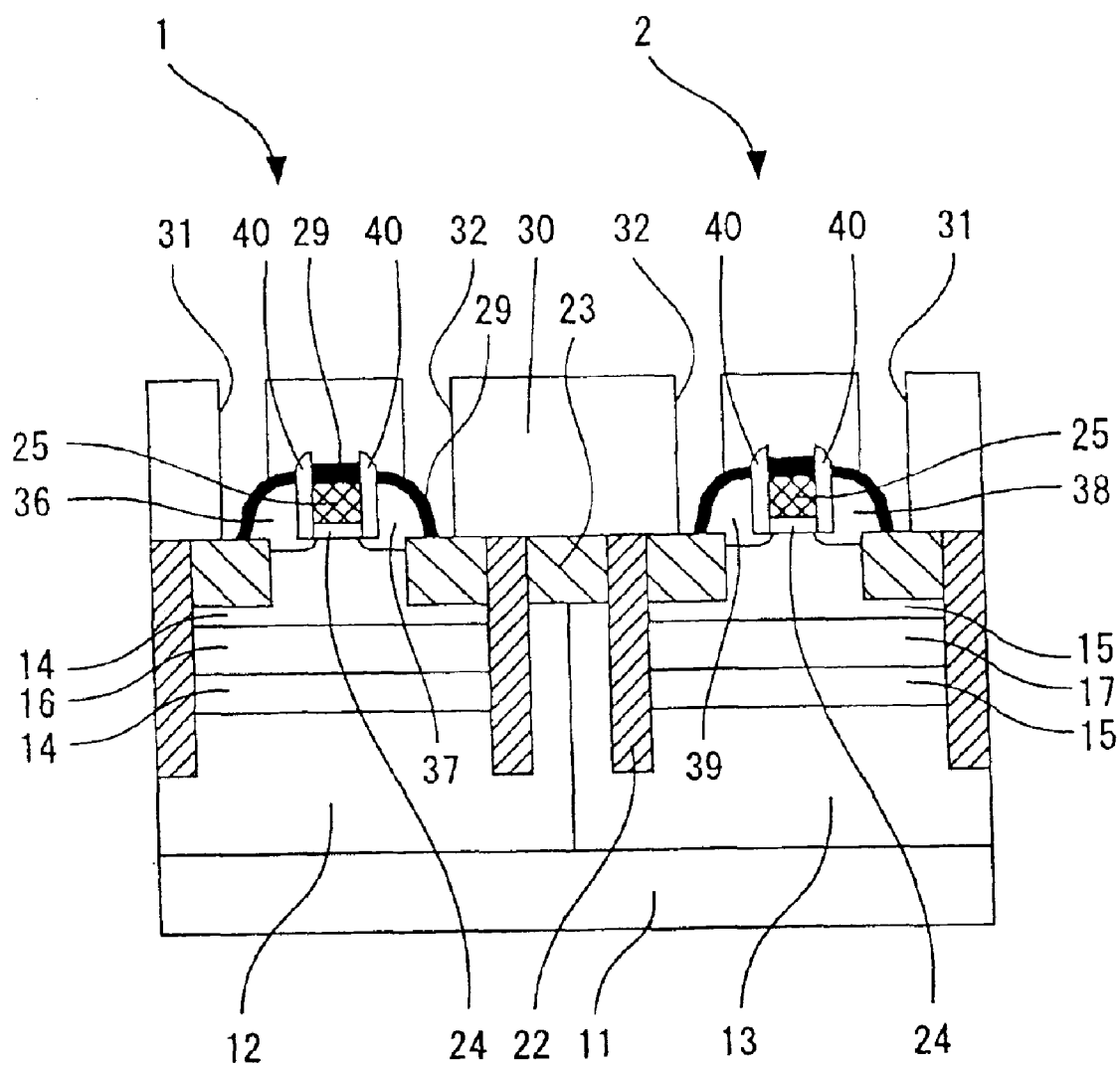
FIG. 13 is a cross-sectional view as viewed in a plane cut along the line A–A' of FIG. 12.
Figure 14:
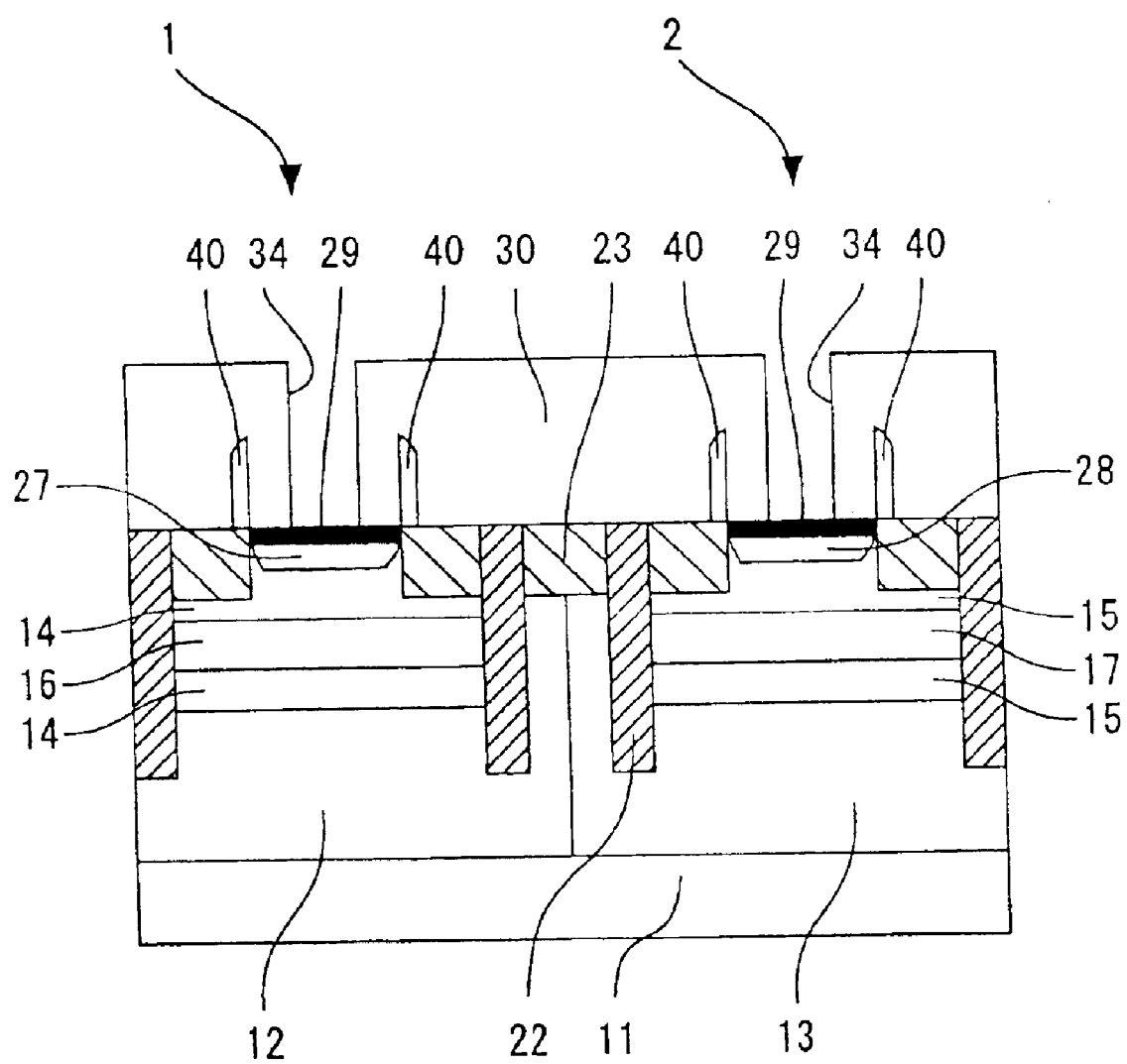
FIG. 14 is a cross-sectional view as viewed in a plane cut along the line B–B' of FIG. 12.
Figure 15:
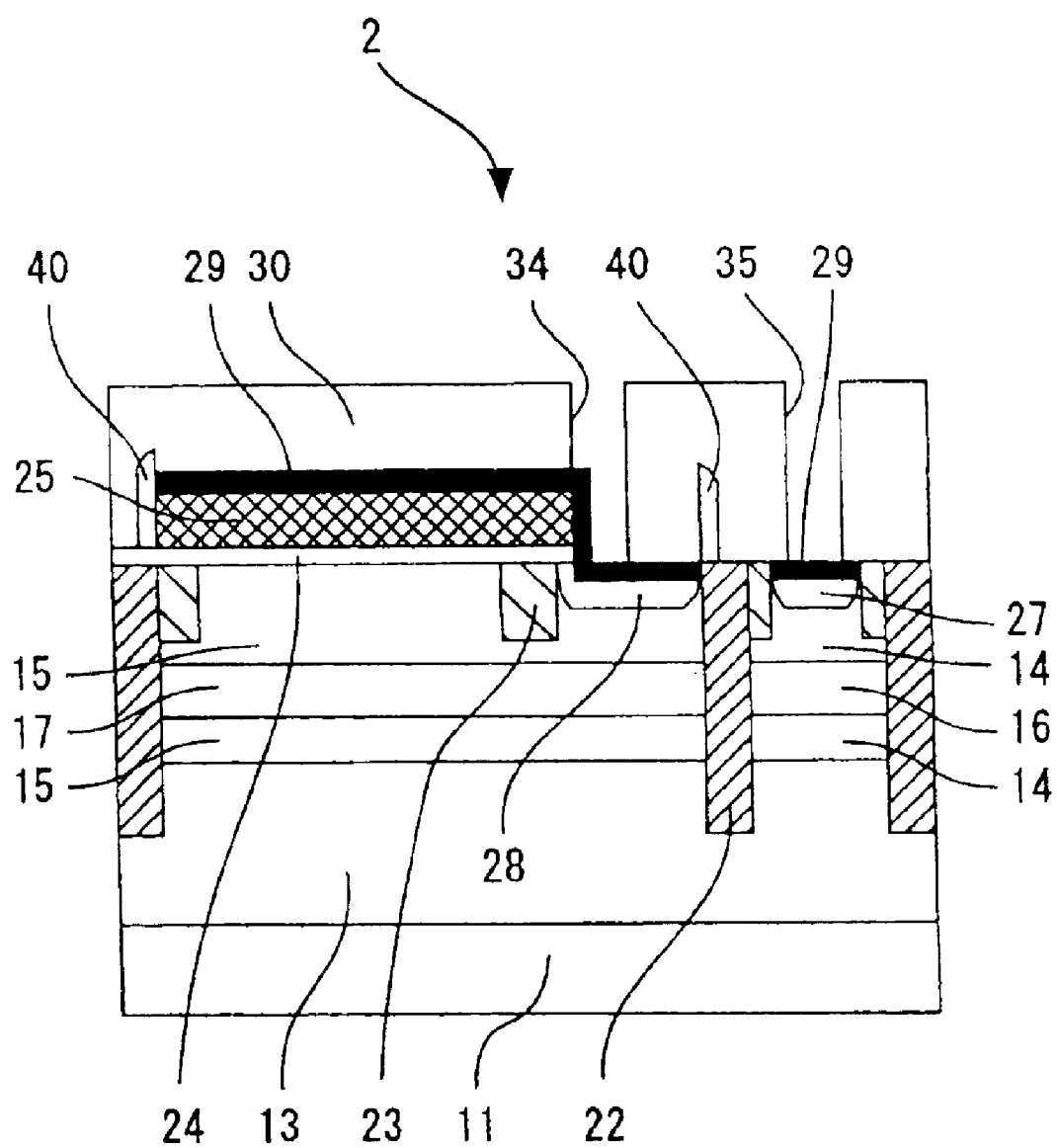
FIG. 15 is a cross-sectional view as viewed in a plane cut along the line C–C' of FIG. 12.
Figure 16:
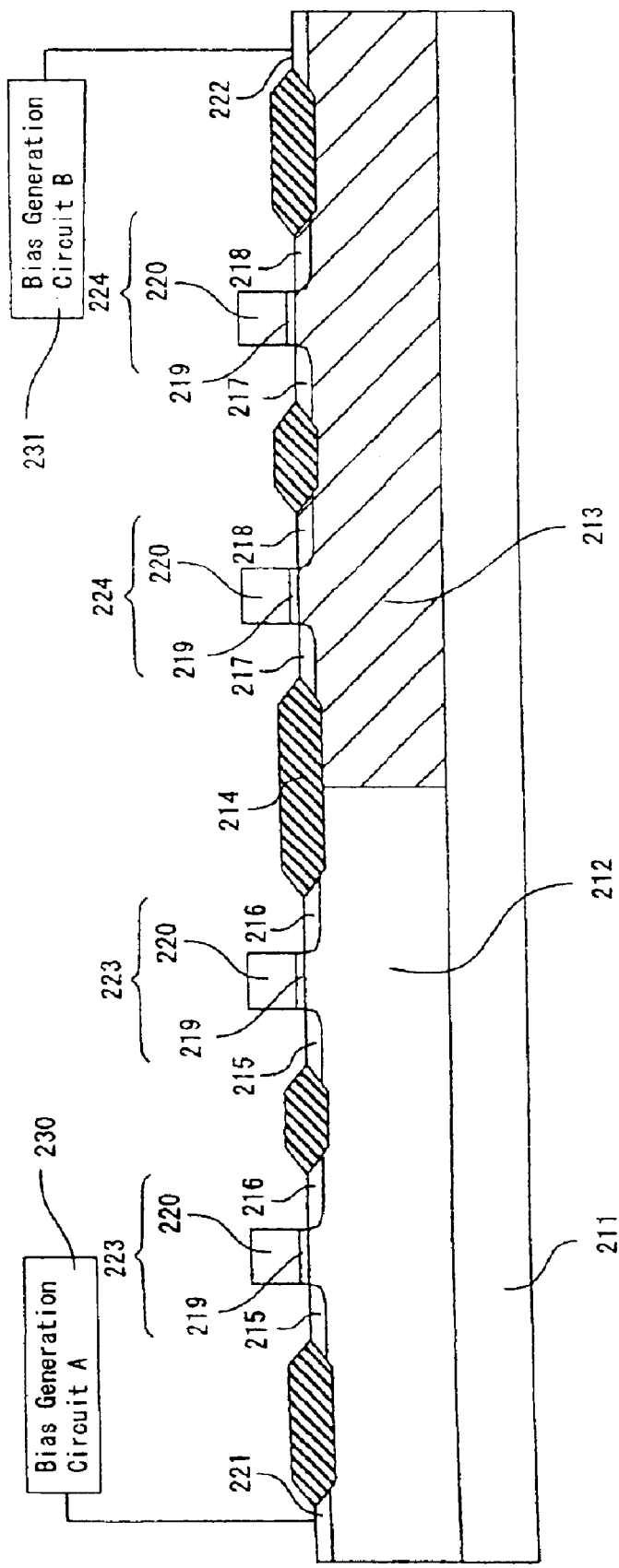
FIG. 16 is a schematic cross-sectional view of a semiconductor device according to a prior art.
Figure 17:
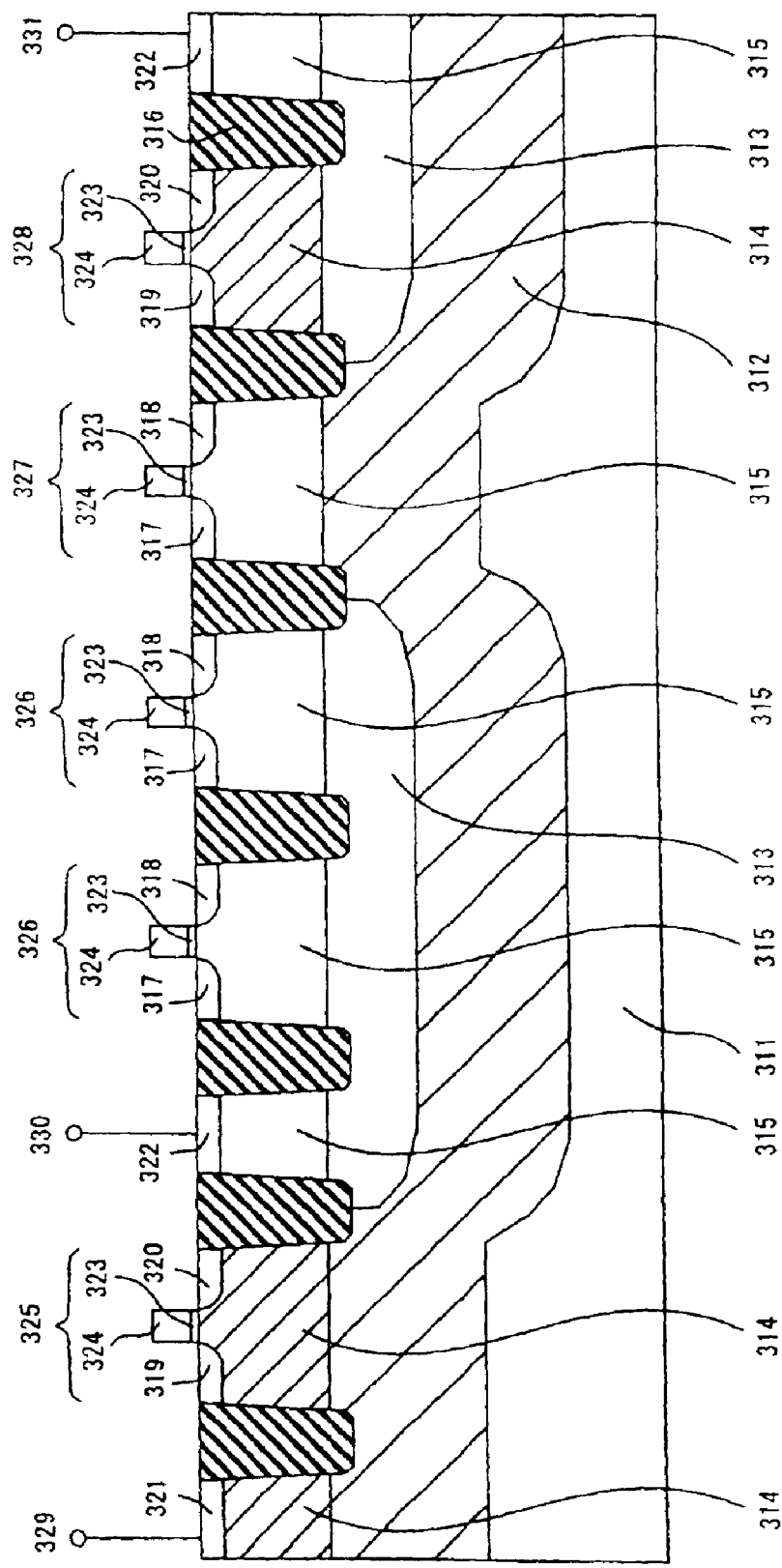
FIG. 17 is a schematic cross-sectional view of a semiconductor device according to a prior art.

FIGS. 12 to 15 are schematic views showing the MOSFET structure of Embodiment 5. FIG. 12 is a plan view, FIG. 13 is a cross-sectional view as viewed in a plane cut along the line A–A' of FIG. 12, FIG. 14 is a cross-sectional view as viewed in a plane cut along the line B–B' of FIG. 12, and FIG. 15 is a cross-sectional view as viewed in a plane cut along the line C–C' of FIG. 12. In addition, silicified regions, interlayer insulators and upper metal interconnections are omitted in FIG. 12, and upper metal interconnections are omitted in FIGS. 13 to 15. FIGS. 12 to 15 show cases of DTMOSs. In these figures, without connections between gate electrode and shallow well region, substrate-bias variable transistors or normal MOSFETs are involved.

In the semiconductor device of this Embodiment 5, an N-type deep well region 12 and a P-type deep well region 13 are formed in a semiconductor substrate 11 as shown in FIG. 13.

A P-type shallow well region 14 is formed in the N-type deep well region 12. A P-type heavily-doped embedded region 16 for reducing the resistance of the P-type shallow well region 13 is formed in the P-type shallow well region 14. Although not shown, P-type shallow well regions 14 of neighboring devices are isolated from each other by an electrically insulative deep device isolation region 22. A gate electrode 25 is formed on the channel region via a gate insulator 24, and further an electrically insulative side wall spacer 40 is formed on a side wall of the gate electrode 25. An electrically conductive side wall spacer is formed on a side wall of the electrically insulative side wall spacer 40, and thus a stacked-type N-type source region 36 and a stacked-type N-type drain region 37 are made up, by which an N-type DTMOS 1 is made up.

An N-type shallow well region 15 is formed in the P-type deep well region 13. An N-type heavily-doped embedded region 17 for reducing the resistance of the N-type shallow well region 15 is formed in the N-type shallow well region 15. Although not shown, N-type shallow well regions 15 of neighboring devices are isolated from each other by an electrically insulative deep device isolation region 22. A gate electrode 25 is formed on the channel region via a gate insulator 24, and further an electrically insulative side wall spacer 40 is formed on a side wall of the gate electrode 25. An electrically conductive side wall spacer is formed on a side wall of the electrically insulative side wall spacer 40, and thus a stacked-type P-type source region 38 and a stacked-type N-type drain region 39 are made up, by which a P-type DTMOS 2 is made up.

The stacked-type N-type source region 36 and the stacked-type P-type source region 38 are electrically connected to the unshown upper metal interconnections via a contact hole 31 formed in an interlayer insulator 30. The stacked-type N-type drain region 37 and the stacked-type P-type drain region 39 are electrically connected to the upper metal interconnections via a contact hole 32 formed in the interlayer insulator 30.

A gate-substrate connection region 33 is provided in the gate electrode 25 as shown in FIG. 12. A region 27 of higher P-type dopant level for the N-type DTMOS 1 and a region 28 of higher N-type dopant level for the P-type DTMOS 2 are formed, respectively, in the shallow well regions 14, 15 under the gate-substrate connection region 33. The gate electrode 25 is electrically connected to the shallow well regions 14, 15 via the gate-substrate connection region 33 and the regions 27, 28 of higher dopant levels. Further, the gate electrode 25 is electrically connected to the upper metal interconnections via a contact hole 34 formed in the interlayer insulator 30.

The P-type deep well region 13 is electrically connected to the upper metal interconnections via the P-type shallow well region 14, the region 27 of higher P-type dopant level and a contact hole 35. Further, although not shown, the N-type deep well region 12 is electrically connected to the upper metal interconnections via the N-type shallow well region 15, the region of higher N-type dopant level and a contact hole. In addition, with a view to reducing the contact resistance, a silicified region 29 is formed over the gate electrode 25, the stacked-type N-type source region 36, the stacked-type N-type drain region 37, the stacked-type P-type source region 38, the stacked-type P-type drain region 39, the region 27 of higher P-type dopant level and the region 28 of higher N-type dopant level.

With a view to reducing the electrostatic capacity, a shallow recess-type device isolation region 23 is formed in regions which are other than the regions needed for forming the channel region, the source region, the drain region, the gate-substrate connection region and the deep well contact and moreover which are other than the deep device isolation region 22. The shallow device isolation region 23 is formed of LOCOS oxide or STI.

The procedure for fabricating this device is described below.

Up to the fabrication of the gate electrode, the fabrication is carried out by the same procedure as in the semiconductor device described in any one of the foregoing Embodiments 1 to 4.

Next, a non-conductive side wall spacer 40 is formed on a side wall of the gate electrode 25. For this non-conductive side wall spacer 40, silicon nitride or silicon oxide or the like may be used. Further, a conductive side wall spacer is formed on a side wall of the non-conductive side wall spacer 40. For this conductive side wall spacer, polysilicon or amorphous silicon or the like may be used, whereas the use of polysilicon is especially preferable. This conductive side wall spacer is electrically insulated from the gate electrode 25 by the non-conductive side wall spacer 40. At this time point, the conductive side wall spacer annularly surrounds the periphery of the gate electrode 25.

Next, with the use of a mask formed of resist, two places of the conductive side wall spacer are etched by etching process. Further, ion injection for the formation of source regions and drain regions is applied to the conductive side wall spacer, and then an annealing for activation of dopants is performed, by which the N-type stacked-type source region 36, the N-type stacked-type drain region 37, the P-type stacked-type drain region 38 and the P-type stacked-type drain region 39 are formed. The ion injection for source regions and drain regions can be carried out, for example, under the conditions of an injection energy of 10 to 180 keV and an injection quantity of $1\times10^{15}$ to $2\times10^{16}$ cm$^{-2}$ for the case where $^{75}$As$^+$ ions are used as dopant ions, or conditions of an injection energy of 5 to 100 keV and an injection quantity of $1\times10^{15}$ to $2\times10^{16}$ cm$^{-2}$ for the case where $^{31}$P$^+$ ions are used as dopant ions, or conditions of an injection energy of 5 to 40 keV and an injection quantity of $1\times10^{15}$ to $2\times10^{15}$ cm$^{-2}$ for the case where $^{11}$B$^+$ ions are used as dopant ions.

In addition, a portion of the gate electrode 25 and the gate oxide 24 thereunder are also removed concurrently by the etching of the conductive side wall spacer, so that dopant ions for the formation of source regions and drain regions are injected also into the portions where the shallow well region has been exposed (gate-substrate connection region 33), thus forming regions of higher dopant level (the region 27 of higher P-type dopant level for the case of NMOS' and the region 28 of higher N-type dopant level for PMOS').

Next, a silicification step is performed so that the gate electrode 25 and the shallow well region 13 are ohmically connected to each other. Thereafter, interconnections are made by the same procedure as in the semiconductor device of the foregoing embodiments.

The N-type DTMOS 1 and the P-type DTMOS 2 are formed by the above-described processes.

For the formation of the substrate-bias variable transistor or the normal MOSFET, it is appropriate to provide a contact region for controlling the voltage of the shallow well region instead of providing the gate-substrate connection region 33.

Forming the source regions 36, 38 and the drain regions 37, 39 into stacked type makes it easier to lessen the junction depth between the source regions 36, 38, the drain regions 37, 39 and the shallow well regions 14, 15. This is because the diffusion rate of dopants in the stacking layer is larger than in the substrate. This effect is remarkable when the stacking layer (conductive gate side wall spacer) is formed of polysilicon. Therefore, a device smaller in single channel effect can easily be fabricated. Further, the areas of the source regions and the drain regions can be reduced to a large extent.

For instance, in normal MOSFETs, the width of the source regions and the drain regions needs to be about three times the minimum machining size with the margin for contact formation taken into consideration. In contrast to this, the source regions and the drain regions, when given in the stacked type, can be reduced in width to about ⅔ of the minimum machining size. The reasons of this are as follows. (1) In the case of source regions and drain regions of normal structure, overflow of the contact into the device isolation region would cause the device isolation region to be dug, so that the junction between the source regions, the drain regions and the well regions would be exposed, which may make a cause of leak current. As a result, there is a need for taking sufficient margin in order to prevent the contact from overflowing from the source regions and the drain regions. In the case of the stacked-type source regions and drain regions, on the other hand, even if the device isolation region is dug, the junction is not exposed, and thus leak current does not matter. (2) Being given in the stacked type, the source regions and the drain regions increase in surface area, which allows larger contact areas between the surfaces of the source regions and drain regions and the contact to be more easily taken during the contact formation.

In an integrated circuit composed of substrate-bias variable transistors or an integrated circuit composed of substrate-bias variable transistors and DTMOS', the device area can effectively be reduced by using two types of device isolation regions different in depth from each other and by using a MOSFET device having stacked-type source region and drain region. In particular, in the case where the shallow device isolation region is formed of STI, there occur almost no bird's beaks, thus making it possible to exploit the full characteristic that the stacked-type source regions and drain regions are small in width.

Thus, according to Embodiment 5 as described above, an integrated circuit including DTMOS' capable of further reduction in device area and high integration is provided.

As apparent from the above description, according to the semiconductor device in the first aspect of the present invention, a plurality of field effect transistors are formed on the second-conductive-type shallow well region, and the shallow device isolation region on the second-conductive-type shallow well region has a depth less than the depth of the junction between the first-conductive-type deep well region and the second-conductive-type shallow well region. Therefore, the plurality of field effect transistors can share the second-conductive-type shallow well region within a circuit block. The second-conductive-type shallow well region, on the other hand, is isolated by the deep device isolation region and the first-conductive-type deep well region, thus making it implementable to easily form a plurality of second-conductive-type shallow well regions independent from one another. Therefore, it becomes possible to apply different well biases to the plurality of second-conductive-type shallow well regions, respectively, via the terminal, so that the field effect transistors can be made to serve as substrate-bias variable transistors. As a result of this, it becomes implementable to provide a plurality of circuit blocks each composed of a plurality of substrate-bias variable transistors on one substrate. Consequently, it becomes implementable to properly divide the circuit blocks into active-state circuit blocks and standby-state circuit blocks, thus making it possible to suppress useless power consumption to a minimum while maintaining the high-speed operation of field effect transistors.

Moreover, by the combinational use of the shallow device isolation region and the deep device isolation region, a two-layer well structure can be implemented, allowing the isolation of the well region to be achieved with smaller margin than in the prior-art device isolation process. Also, two basic circuit blocks can easily be isolated from each other by one deep device isolation region. Thus, a semiconductor device of higher integration can be realized.

Consequently, according to the semiconductor device in the first aspect of the invention, an integrated circuit including substrate-bias variable transistors capable of high-speed operation, low-power-consumption operation and high integration is provided.

The semiconductor device of the second aspect of the invention is fulfilled by making up the semiconductor device of the first aspect into a complementary-type structure. Therefore, the same working effects as those of the semiconductor device of the first aspect of the invention can be produced, and moreover the field effect transistors can be given symmetric output characteristics, allowing the power consumption to be further lowered.

Also, in the semiconductor device of the third aspect of the invention, its structure at the second-conductive-type shallow well region and the first-conductive-type deep well region is identical to that of the semiconductor device of the first aspect of the invention, thus producing the same working effects as those of the semiconductor device of the first aspect.

Meanwhile, the first-conductive-type shallow well region may be commonized with first-conductive-type shallow well regions present at other places through the first-conductive-type deep well region. In this case, a plurality of field effect transistors present on the commonized first-conductive-type shallow well region may be formed as normal field effect transistors, or as one circuit block composed of substrate-bias variable transistors.

In one embodiment, by virtue of the source regions and the drain regions of the field effect transistors being given in the stacked type, even if the contact has overflowed into the device isolation region, making the device isolation region dug, the junction between the source regions/the drain regions and the well regions is not exposed, so that leak current does not matter.

Furthermore, by being given in the stacked type, the source regions and the drain regions increase in surface area, which allows larger contact areas between the surfaces of the source regions and drain regions and the contact to be more easily taken during the contact formation.

Still further, in an integrated circuit composed of substrate-bias variable transistors, the device area can effectively be reduced by virtue of the use of two types of device isolation regions different in depth from each other and the use of field effect transistors having stacked-type source regions and drain regions.

Consequently, according to this embodiment, an integrated circuit including substrate-bias variable transistors capable of further reduction in device area and high integration is provided.

In the semiconductor device of the fourth aspect of the invention, since the second-conductive-type shallow well region is not isolated in the shallow device isolation region, the second-conductive-type shallow well region becomes common within one circuit block. Meanwhile, since the second-conductive-type shallow well regions are isolated by the deep device isolation region and the first-conductive-type deep well region, a plurality of independent shallow well regions can easily be formed. Accordingly, different well biases can be applied to the plurality of second-conductive-type shallow well regions, respectively, via the terminal. This makes it possible to provide a plurality of circuit blocks on one substrate. Consequently, it becomes implementable to properly divide the circuit blocks into active-state circuit blocks and standby-state circuit blocks, thus making it possible to suppress useless power consumption to a minimum while maintaining the high-speed operation of field effect transistors.

Further, according to this semiconductor device, the device isolation of the dynamic threshold transistors is facilitated by the deep device isolation region. Accordingly, there is no need for using the three-layer well structure for mixing the substrate-bias variable transistors and the dynamic threshold transistors, as would be involved in the prior art. Thus, the energy for dopant ion injection during the formation of the deep well regions can be lowered, so that crystal defects can be reduced. As a result of this, the annealing temperature for recovery of crystal defects can be lowered, so that the diffusion of dopant ions can be suppressed. Consequently, a device smaller in leak current due to crystal defects can be obtained, and moreover the margin required for boundaries of well regions can be reduced.

Thus, an integrated circuit including substrate-bias variable transistors and dynamic threshold transistors capable of high-speed operation, low-power-consumption operation and high integration is obtained.

The semiconductor device of the fifth aspect of the invention is fulfilled by making up the semiconductor device of the fourth aspect into a complementary-type structure. Therefore, the same working effects as those of the semiconductor device of the fourth aspect of the invention can be produced, and moreover the field effect transistors can be given symmetric output characteristics, allowing the power consumption to be further lowered.

In the semiconductor device of the sixth aspect of the invention, its structure at the second-conductive-type shallow well region and the first-conductive-type deep well region is identical to that of the semiconductor device of the first aspect of the invention, thus producing the same working effects as those of the semiconductor device of the fourth aspect.

Meanwhile, in the semiconductor device of the sixth aspect of the invention, the first-conductive-type shallow well region may be commonized with first-conductive-type shallow well regions present at other places through the first-conductive-type deep well region. In this case, a plurality of field effect transistors present on the commonized first-conductive-type shallow well region may be formed as normal field effect transistors, or as one circuit block composed of substrate-bias variable transistors.

Also, in one embodiment, by virtue of the source regions and the drain regions of the field effect transistors being given in the stacked type, even if the contact has overflowed into the device isolation region, making the device isolation region dug, the junction between the source regions/the drain regions and the well regions is not exposed, so that leak current does not matter.

Furthermore, by being given in the stacked type, the source regions and the drain regions increase in surface area, which allows larger contact areas between the surfaces of the source regions and drain regions and the contact to be taken during the contact formation.

Still further, in an integrated circuit composed of substrate-bias variable transistors and dynamic threshold transistors, the device area can effectively be reduced by virtue of the use of two types of device isolation regions different in depth from each other and the use of field effect transistors having stacked-type source regions and drain regions.

Consequently, according to this embodiment, an integrated circuit including substrate-bias variable transistors and dynamic threshold transistors capable of further reduction in device area and high integration is obtained.

Also, in one embodiment of the semiconductor device according to the second or fifth aspect of the invention, the composite device isolation region has deep device isolation regions formed on both sides of the shallow device isolation region. For this composite device isolation region, it is easier to fulfill the filling of oxide, as compared with the case where merely a large-width deep device isolation region is provided. This makes it relatively easier to form the large-width composite device isolation region. Further, with this composite device isolation region, by virtue of the presence of the deep device isolation regions on both sides of the shallow device isolation region, it becomes implementable to effectively prevent punch-throughs between the first-conductive-type deep well region and the first-conductive-type shallow well region, or between the second-conductive-type deep well region and the second-conductive-type shallow well region. Therefore, the basic circuit block composed of the first-conductive-type substrate-bias variable transistors and the basic circuit block composed of the second-conductive-type substrate-bias variable transistors can effectively be isolated from each other with less device isolation margin.

Also, in one embodiment of the semiconductor device according to the third or sixth aspect of the invention, the composite device isolation region comprises a deep device isolation region and shallow device isolation regions positioned on both sides of the shallow device isolation region. Therefore, it is easier to fulfill the filling of oxide into the composite device isolation region, as compared with the case where merely a large-width deep device isolation region is provided. This makes it relatively easier to form the large-width composite device isolation region. Further, with this composite device isolation region, it becomes implementable to effectively isolate the first-conductive-type and the second-conductive-type shallow well regions with less device isolation margin, and therefore to suppress changes in threshold value of field effect transistors.

Also, in one embodiment, since the shallow device isolation region is formed of LOCOS oxide, two types of device isolation regions different in depth from each other can be formed with relatively simple process.

Also, according to one embodiment, since the shallow device isolation region is formed of STI, there are no noticeable bird's beaks as would be involved in the case where LOCOS oxide is used. Accordingly, the margin required for device isolation can be further reduced.

Also, according to the method for manufacturing a semiconductor device in the seventh aspect of the invention, the first film serves both as a mask for forming the first isolation recess and as a mask for forming the second isolation recess. Therefore, the steps for fabricating device isolation regions of the semiconductor device can be reduced. Further, in the formation of the second isolation recess, the first isolation recess is also etched uniformly, thus eliminating the occurrence of unnecessary step gaps in the first isolation recess.

In one embodiment, the first film, which needs to function as a mask two times, is formed of a layer-stacked film resistant to ashing process or hydrofluorination process, while the second film, which needs to function as a mask only one time, is formed of photoresist that can be removed easily with ashing process. Therefore, the semiconductor device manufacturing method can be simplified.

What is claimed is:

1. A semiconductor device comprising:
   a semiconductor substrate (11, 211, 311, 411);
   a first-conductive-type deep well region (12, 227, 312; 13, 228, 313) formed in the semiconductor substrate (11, 211, 311, 411);
   a second-conductive-type shallow well region (14, 212, 315; 15, 213, 314) formed in the first-conductive-type deep well region (12, 227, 312; 13, 228, 313);
   a plurality of field effect transistors (223, 326; 224, 325) formed on the second-conductive-type shallow well region (14, 212, 315; 15, 213, 314);
   a shallow device isolation region (23, 214, 250, 332, 336) which is formed on the second-conductive-type shallow well region (14, 212, 315; 15, 213, 314) and which has a depth less than a depth of a junction between the first-conductive-type deep well region (12, 227, 312; 13, 228, 313) and the second-conductive-type shallow well region (14, 212, 315; 15, 213, 314);
   a deep device isolation region (22, 226, 251, 291, 333, 335) which is formed on the first-conductive-type deep well region (12, 227, 312; 13, 228, 313) through the second-conductive-type shallow well region (14, 212, 315; 15, 213, 314) and which has a depth more than the depth of the junction between the first-conductive-type deep well region (12, 227, 312; 13, 228, 313) and the second-conductive-type shallow well region (14, 212, 315; 15, 213, 314);
   a terminal (221, 222) which is formed on the second-conductive-type shallow well region (14, 212, 315; 15, 213, 314) and which serves for changing a voltage of the second-conductive-type shallow well region (14, 212, 315; 15, 213, 314),
   a second-conductive-type deep well region (13, 228, 313; 12, 227, 312) formed in the semiconductor substrate (11, 211, 311, 411);
   a first-conductive-type shallow well region (15, 213, 314; 14, 212, 315) formed in the second-conductive-type deep well region (13, 228, 313; 12, 227, 312);
   a plurality of field effect transistors (223, 326; 224, 325) formed on the first-conductive-type shallow well region (15, 213, 314; 14, 212, 315);
   a shallow device isolation region (23, 214, 250, 332, 336) which is formed on the first-conductive-type shallow well region (15, 213, 314; 14, 212, 315) and which has a depth less than a depth of a junction between the second-conductive-type deep well region (13, 228, 313; 12, 227, 312) and the first-conductive-type shallow well region (15, 213, 314; 14, 212, 315);
   a deep device isolation region (22, 226, 251, 291, 333, 335) which is formed on the second-conductive-type deep well region (13, 228, 313; 12, 227, 312) through the first-conductive-type shallow well region (15, 213, 314; 14, 212, 315) and which has a depth more than the depth of the junction between the second-conductive-type deep well region (13, 228, 313; 12, 227, 312) and the first-conductive-type shallow well region (15, 213, 314; 14, 212, 315);
   a boundary-portion device isolation region (225; 250, 251; 334; 335, 336) provided at a boundary portion between the first-conductive-type and the second-conductive-type deep well regions (13, 228, 313; 12, 227, 312) and at a boundary portion between the first-conductive-type and the second-conductive-type shallow well regions (14, 212, 315; 15, 213, 314); and
   a terminal (222, 221) which is formed on the first-conductive-type shallow well region (15, 213, 314; 14, 212, 315) and which serves for changing a voltage of the first-conductive-type shallow well region (15, 213, 314; 14, 212, 315).

2. A semiconductor device comprising:
   a semiconductor substrate (11, 211, 311, 411);
   a first-conductive-type deep well region (12, 227, 312; 13, 228, 313) formed in the semiconductor substrate (11, 211, 311, 411);
   a second-conductive-type shallow well region (14, 212, 315; 15, 213, 314) formed in the first-conductive-type deep well region (12, 227, 312; 13, 228, 313);
   a plurality of field effect transistors (223, 326; 224, 325) formed on the second-conductive-type shallow well region (14, 212, 315; 15, 213, 314);
   a shallow device isolation region (23, 214, 250, 332, 336) which is formed on the second-conductive-type shallow well region (14, 212, 315; 15, 213, 314) and which has a depth less than a depth of a junction between the first-conductive-type deep well region (12, 227, 312; 13, 228, 313) and the second-conductive-type shallow well region (14, 212, 315; 15, 213, 314);
   a deep device isolation region (22, 226, 251, 291, 333, 335) which is formed on the first-conductive-type deep well region (12, 227, 312; 13, 228, 313) through the second-conductive-type shallow well region (14, 212, 315; 15, 213, 314) and which has a depth more than the depth of the junction between the first-conductive-type deep well region (12, 227, 312; 13, 228, 313) and the second-conductive-type shallow well region (14, 212, 315; 15, 213, 314);
   a terminal (221, 222) which is formed on the second-conductive-type shallow well region (14, 212, 315; 15, 213, 314) and which serves for changing a voltage of the second-conductive-type shallow well region (14, 212, 315; 15, 213, 314);

at least one first-conductive-type shallow well region (213) formed in the first-conductive-type deep well region (227);

a plurality of field effect transistors formed on the first-conductive-type shallow well region (213);

a shallow device isolation region (250) which is formed on the first-conductive-type shallow well region (213) and which has a depth less than a depth of a junction between the first-conductive-type deep well region (227) and at least one second-conductive-type shallow well region (212);

a boundary-portion device isolation region (250, 251) provided at a boundary portion between the at least one first-conductive-type and the at least one second-conductive-type shallow well regions (212, 213), and wherein the combination of a single first-conductive-type shallow well region 213 and a single second-conductive-type shallow well region 212 is excluded.

3. The semiconductor device according to claim 1, wherein the field effect transistors have a stacking-type structure in which source region and drain region of each field effect transistor are partly positioned upper than a plane formed by gate oxide of the field effect transistor.

4. The semiconductor device according to claim 1, further comprising:

a dynamic threshold transistor (1, 2, 327, 328) which is formed on the second-conductive-type shallow well region (14, 212, 315; 15, 213, 314) and in which a gate electrode and the second-conductive-type shallow well region (14, 212, 315; 15, 213, 314) are short-circuited, wherein the dynamic threshold transistor (1, 2, 327, 328) is isolated from other devices by the deep device isolation region (22, 226, 251, 333, 335).

5. The semiconductor device according to claim 1 further comprising:

dynamic threshold transistors (1, 2, 327, 328) which are respectively formed on the first-conductive-type and the second-conductive-type shallow well regions (14, 212, 315; 15, 213, 314) and in which gate electrodes and the first-conductive-type and the second-conductive-type shallow well regions (14, 212, 315; 15, 213, 314) are short-circuited, respectively, wherein the dynamic threshold transistor (1, 2, 327, 328) is isolated from other devices by the deep device isolation region (22, 226, 251, 291, 333, 335).

6. The semiconductor device according to claim 2, further comprising:

a dynamic threshold transistor (1, 2, 327, 328) which is formed on the second-conductive-type shallow well region (14, 212, 315; 15, 213, 314) and in which a gate electrode and the second-conductive-type shallow well region (14, 212, 315; 15, 213, 314) are short-circuited, wherein the dynamic threshold transistor (1, 2, 327, 328) is isolated from other devices by the deep device isolation region (22, 226, 251, 291, 333, 335).

7. The semiconductor device according to any one of claims 4 to 6 wherein the field effect transistors and the dynamic threshold transistors (1, 2) have a stacking-type structure in which source region and drain region of each field effect transistor and each dynamic threshold transistor are partly positioned upper than a plane formed by gate oxide of the field effect transistor and the dynamic threshold transistor (1, 2).

8. The semiconductor device according to claim 1 wherein the boundary-portion device isolation region (225; 250, 251; 334; 335, 336) is a composite device isolation region which is provided at a boundary portion between the first-conductive-type and the second-conductive-type deep well regions (13, 228, 313; 12, 227, 312) and at a boundary portion between the first-conductive-type and the second-conductive-type shallow well regions (14, 212, 315; 15, 213, 314), and which is composed of a shallow device isolation region (250, 336) having a depth less than a depth of a junction between the shallow well regions and the deep well regions, and deep device isolation regions (251, 335) positioned on both sides of the shallow device isolation region (250, 336) and having a depth more than the depth of the junction.

9. A semiconductor device comprising:

a semiconductor substrate (11, 211, 311, 411);

a first-conductive-type deep well region (12, 227, 312; 13, 228, 313) formed in the semiconductor substrate (11, 211, 311, 411);

a second-conductive-type shallow well region (14, 212, 315; 15, 213, 314) formed in the first-conductive-type deep well region (12, 227, 312; 13, 228, 313);

a plurality of field effect transistors (223, 326; 224, 325) formed on the second-conductive-type shallow well region (14, 212, 315; 15, 213, 314);

a shallow device isolation region (23, 214, 250, 332, 336) which is formed on the second-conductive-type shallow well region (14, 212, 315; 15, 213, 314) and which has a depth less than a depth of a junction between the first-conductive-type deep well region (12, 227, 312; 13, 228, 313) and the second-conductive-type shallow well region (14, 212, 315; 15, 213, 314);

a deep device isolation region (22, 226, 251, 291, 333, 335) which is formed on the first-conductive-type deep well region (12, 227, 312; 13, 228, 313) through the second-conductive-type shallow well region (14, 212, 315; 15, 213, 314) and which has a depth more than the depth of the junction between the first-conductive-type deep well region (12, 227, 312; 13, 228, 313) and the second-conductive-type shallow well region (14, 212, 315; 15, 213, 314);

a terminal (221, 222) which is formed on the second-conductive-type shallow well region (14, 212, 315; 15, 213, 314) and which serves for changing a voltage of the second-conductive-type shallow well region (14, 212, 315; 15, 213, 314); and wherein the boundary-portion device isolation region (250, 251) is a composite device isolation region which is provided at a boundary portion between the first-conductive-type and the second-conductive-type shallow well regions (212, 213), and which is composed of a deep device isolation region (251) having a depth more than a depth of a junction between the first-conductive-type deep well region (227, 228) and the second-conductive-type shallow well region (212, 213), and shallow device isolation regions (250) positioned on both sides of the deep device isolation region (251) and having a depth less than the depth of the junction.

10. The semiconductor device according to claim 1, wherein the shallow device isolation region (214, 332) is formed of LOCOS oxide.

11. The semiconductor device according to claim 1, wherein the shallow device isolation region (250, 336) is formed of STI.

12. A method for manufacturing a semiconductor device which comprises:
- a semiconductor substrate (11, 211, 311, 411, 411);
- a first-conductive-type deep well region (12, 227, 312; 13, 228, 313) formed in the semiconductor substrate (11, 211, 311, 411);
- a second-conductive-type shallow well region (14, 212, 315; 15, 213, 314) formed in the first-conductive-type deep well region (12, 227, 312; 13, 228, 313);
- a plurality of field effect transistors (223, 326; 224, 325) formed on the second-conductive-type shallow well region (14, 212, 315; 15, 213, 314);
- a shallow device isolation region (23, 214, 250, 332, 336) which is formed on the second-conductive-type shallow well region (14, 212, 315; 15, 213, 314) and which has a depth less than a depth of a junction between the first-conductive-type deep well region (12, 227, 312; 13, 228, 313) and the second-conductive-type shallow well region (14, 212, 315; 15, 213, 314);
- a deep device isolation region (22, 226, 251, 291, 333, 335) which is formed on the first-conductive-type deep well region (12, 227, 312; 13, 228, 313) through the second-conductive-type shallow well region (14, 212, 315; 15, 213, 314) and which has a depth more than the depth of the junction between the first-conductive-type deep well region (12, 227, 312; 13, 228, 313) and the second-conductive-type shallow well region (14, 212, 315; 15, 213, 314); and
- a terminal (221, 222) which is formed on the second-conductive-type shallow well region (14, 212, 315; 15, 213, 314) and which serves for changing a voltage of the second-conductive-type shallow well region (14, 212, 315; 15, 213, 314), wherein the shallow device isolation region (250, 336) is formed of STI, the method comprising the steps of:
- forming a first film (412, 413) on the semiconductor substrate (11, 211, 311, 411, 411);
- forming a first opening window in the first film (412, 413);
- forming a first isolation recess by partly etching the semiconductor substrate (11, 211, 311, 411) with the first film (412, 413) used as a mask;
- forming a second film (414) on the first film (412, 413) and the first isolation recess;
- forming a second opening window in the second film (414);
- partly etching the first film (412, 413) with the second film (414) used as a mask;
- forming a second isolation recess by partly etching the semiconductor substrate (11, 211, 311, 411, 411) with the first film (412, 413) used as a mask; and
- filling the first isolation recess and the second isolation recess by depositing an insulating film (415) on the first film (412, 413), the first isolation recess and the second isolation recess.

13. The method for manufacturing a semiconductor device according to claim 12, wherein the first film (412, 413) is a layer-stacked film of silicon oxide (412) and silicon nitride (413), the second film (414) is photoresist (414), and the insulating film (415) is oxide.

14. The semiconductor device according to claim 2, wherein the shallow device isolation region (214, 332) is formed of LOCOS oxide.

15. The semiconductor device according to claim 2, wherein the shallow device isolation region (250, 336) is formed of STI.

16. The semiconductor device according to claim 2, wherein the field effect transistors have a stacking-type structure in which source region and drain region of each field effect transistor are partly positioned upper than a plane formed by gate oxide of the field effect transistor.

17. The semiconductor device according to claim 2, further comprising:
- a dynamic threshold transistor (1, 2, 327, 328) which is formed on the second-conductive-type shallow well region (14, 212, 315; 15, 213, 314) and in which a gate electrode and the second-conductive-type shallow well region (14, 212, 315; 15, 213, 314) are short-circuited, wherein
- the dynamic threshold transistor (1, 2, 327, 328) is isolated from other devices by the deep device isolation region (22, 226, 251, 291, 333, 335).

* * * * *